US006628040B2

(12) United States Patent
Pelrine et al.

(10) Patent No.: US 6,628,040 B2
(45) Date of Patent: Sep. 30, 2003

(54) ELECTROACTIVE POLYMER THERMAL ELECTRIC GENERATORS

(75) Inventors: Ronald E. Pelrine, Boulder, CO (US); Roy D. Kornbluh, Palo Alto, CA (US); Joseph Stephen Eckerle, Redwood City, CA (US); Qibing Pei, Fremont, CA (US)

(73) Assignee: SRI International, Menlo Park, CA (US)

(*) Notice: Subject to any disclaimer, the term of this patent is extended or adjusted under 35 U.S.C. 154(b) by 171 days.

(21) Appl. No.: 09/792,431

(22) Filed: Feb. 23, 2001

(65) Prior Publication Data

US 2001/0032663 A1 Oct. 25, 2001

Related U.S. Application Data

(60) Provisional application No. 60/184,217, filed on Feb. 23, 2000, and provisional application No. 60/190,713, filed on Mar. 17, 2000.

(51) Int. Cl.[7] ................................................. H02N 3/00
(52) U.S. Cl. ........................ 310/307; 310/339; 310/800; 310/309
(58) Field of Search ................................. 310/309, 339, 310/800, 306, 307

(56) References Cited

U.S. PATENT DOCUMENTS

| | | | |
|---|---|---|---|
| 3,832,580 A | 8/1974 | Yamamuro et al. | 310/330 |
| 4,442,372 A | 4/1984 | Roberts | 310/339 |
| 4,733,121 A | 3/1988 | Herbert | 310/311 |
| 4,877,988 A | 10/1989 | McGinniss et al. | 310/306 |
| 5,356,500 A | 10/1994 | Scheinbeim et al. | 156/229 |
| 5,440,194 A | 8/1995 | Beurrier | 310/328 |
| 5,682,075 A * | 10/1997 | Bolleman et al. | 310/309 |
| 5,977,685 A | 11/1999 | Kurita et al. | 310/311 |
| 6,048,622 A | 4/2000 | Hagood, IV et al. | 428/461 |
| 6,060,811 A | 5/2000 | Fox et al. | 310/311 |
| 6,084,321 A | 7/2000 | Hunter et al. | 310/20 |
| 6,184,608 B1 | 2/2001 | Cabuz et al. | 310/309 |
| 6,184,609 B1 | 2/2001 | Johansson et al. | 310/328 |
| 6,249,076 B1 | 6/2001 | Madden et al. | 310/363 |
| 6,255,758 B1 * | 7/2001 | Cabuz et al. | 310/309 |
| 6,358,021 B1 * | 3/2002 | Cabuz | 417/413.2 |
| 6,411,013 B1 * | 6/2002 | Horning | 310/330 |

FOREIGN PATENT DOCUMENTS

| | | | |
|---|---|---|---|
| DE | 199 52 062 A1 | 10/1999 | H02N/2/18 |
| EP | 59-126689 | 7/1984 | H01L/41/08 |
| EP | 7-111785 | 4/1995 | H02N/2/00 |
| RU | WO 99/23749 | 5/1999 | H02N/2/18 |
| WO | WO 94/18433 | 8/1994 | F01B/29/15 |
| WO | WO 97/15876 | 1/1997 | G05F/5/00 |

* cited by examiner

Primary Examiner—Thomas M. Dougherty
(74) Attorney, Agent, or Firm—Beyer Weaver & Thomas, LLP

(57) ABSTRACT

This disclosed generators include one or more transducers that use electroactive polymer films to convert thermally generated mechanical energy to electrical energy. The generators may include one or more transmission mechanisms that convert a portion of thermal energy generated from a heat source such as internal combustion, external combustion, solar energy, geothermal energy or waste heat, to mechanical energy that is used to drive the one or more transducers located in the generator. The energy received by the transducers may be converted to electrical energy by the transducers in conjunction with conditioning electronics located within the generator. One embodiment of the present invention provides an energy conversion device with two chambers each chamber including a diaphragm transducer that may convert thermal energy to electricity using a thermodynamic cycle such as a Stirling gas cycle. The thermodynamic cycle of the energy conversion device may be reversed to provide cooling to an external device such as a semiconductor device.

127 Claims, 17 Drawing Sheets

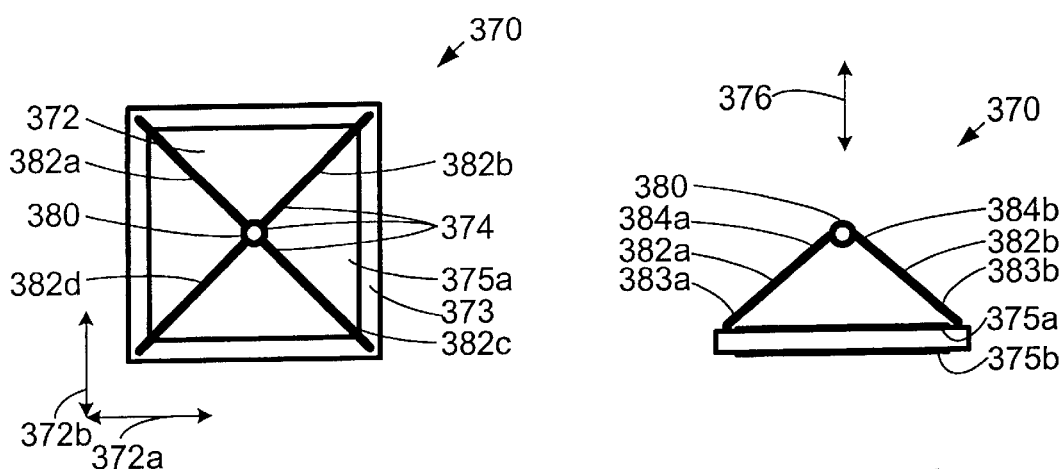
Figure 5H
Figure 5I
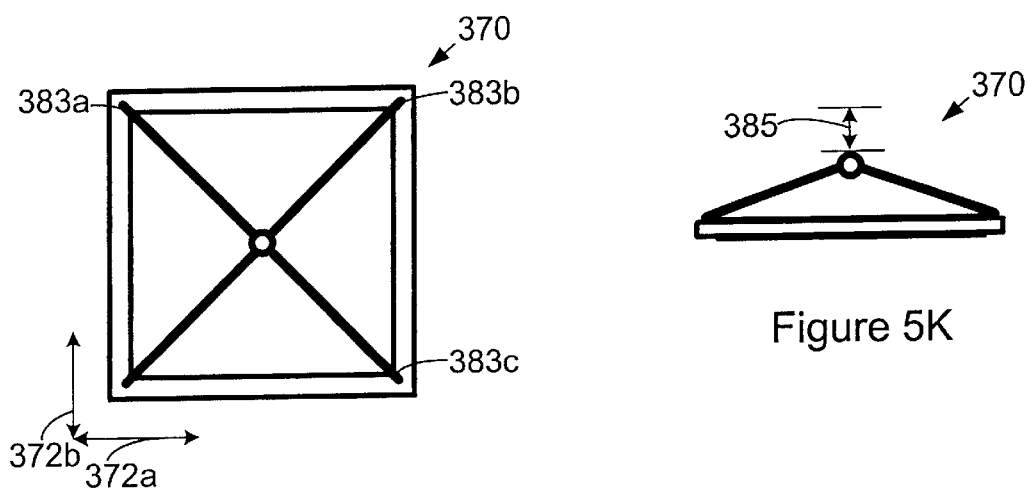
Figure 5J
Figure 5K
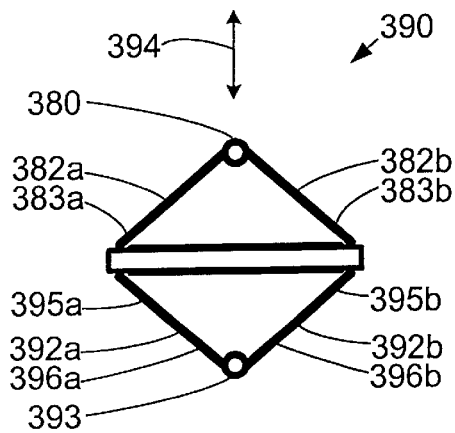
Figure 5L

ELECTROACTIVE POLYMER THERMAL ELECTRIC GENERATORS

CROSS-REFERENCE TO RELATED APPLICATION

This application claims priority under 35 U.S.C. §119(e) from U.S. Provisional Patent Application No. 60/184,217 filed Feb. 23, 2000, naming Q. Pei et al. as inventors, and titled "ELECTROELASTOMERS AND THEIR USE FOR POWER GENERATION", which is incorporated by reference herein for all purposes; it also claims priority under 35 U.S.C. §119(e) from U.S. Provisional Patent Application No. 60/190,713 filed Mar. 17, 2000, naming J. S. Eckerle et al. as inventors, and titled "ARTIFICIAL MUSCLE GENERATOR", which is incorporated by reference herein for all purposes. This application cross references U.S. patent application entitled "ELECTROACTIVE POLYMER GENERATORS" naming R. E. Pelrine et al. as inventors, filed on Jul. 20, 2000 (U.S. application Ser. No. 09/619,848), which is incorporated by reference herein for all purposes.

BACKGROUND OF THE INVENTION

The present invention relates generally to Electro Active Polymers (EAP) that convert between electrical energy and mechanical energy. More particularly, the present invention relates to EAP polymers and their use in energy conversion devices that convert between thermal, mechanical, and electrical energy from thermal energy sources such as combustion.

In many applications, it is desirable to convert between electrical energy and mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines). These applications include one or more transducers that convert mechanical energy into electrical energy. Common electric generator technologies, such as electromagnetic generators, are also not suitable for many of these applications, e.g., when the required device size is small. These technologies are also not ideal when a large number of devices must be integrated into a single structure or under various performance conditions such as when high power density output is required at relatively low frequencies.

Several 'smart materials' have been used to convert between electrical and mechanical energy with limited success. These smart materials include piezoelectric ceramics, shape memory alloys and magnetostrictive materials. However, each smart material has a number of limitations that prevent its broad usage. Certain piezoelectric ceramics, such as lead zirconium titanate (PZT), have been used to convert electrical to mechanical energy. While having suitable efficiency for a few applications, these piezoelectric ceramics are typically limited to a strain below about 1.6 percent and are often not suitable for applications requiring greater strains than this. In addition, the high density of these materials often eliminates them from applications requiring low weight. Irradiated polyvinylidene difluoride (PVDF) when combined with various copolymers is an electroactive polymer reported to have a strain of up to 4 percent when converting from electrical to mechanical energy. Similar to the piezoelectric ceramics, the PVDF-based material is often not suitable for applications requiring strains greater than 4 percent. Shape memory alloys, such as nitinol, are capable of large strains and force outputs. These shape memory alloys have been limited from broad use by unacceptable energy efficiency, poor response time and prohibitive cost.

In addition to the performance limitations of piezoelectric ceramics and irradiated PVDF-based materials, their fabrication often presents a barrier to acceptability. Single crystal piezoelectric ceramics must be grown at high temperatures coupled with a very slow cooling down process. Irradiated PVDF-based materials must be exposed to an electron beam for processing. Both these processes are expensive and complex and may limit acceptability of these materials.

As advances in microchip fabrication continue to reduce the cost and the size of logic devices while increasing their computing capabilities, new portable electronic devices using these logic devices are continually being developed. Also, these logic devices are being incorporated into existing electronic devices to increase their functionality and in some case to enable portability. Cellular phones, pagers, personal digital assistants, MP-3 players, navigational devices and locator devices are a few examples of newer portable electronic devices. These portable electronic devices along with other older portable electronic devices such as flashlights, electric tools, credit card readers and radios are utilized in many activities. All of these devices require a source of electrical energy to operate. Typically, the devices employ disposable or rechargeable batteries as an electrical power source. Performance parameters of the batteries such as cost, weight and life-time are critical element in the design and operation of these devices. In other applications, light-weight power sources are needed to power newer portable electronic devices such as minirobots and microrobots and micro-air vehicles that may be used for surveying and reconnaissance for civilian and military application. For these devices, power to weight ratios are a critical consideration.

With the portable electronics devices describe above, it would be desirable to provide portable energy sources with a high power to weight ratio that generate power over a significant time period. Hydrocarbon based fuels have a relatively high energy density as compared to batteries. For instance, the energy density of a hydrocarbon based fuel may be 20 times higher than a density of a battery. Thermoelectromechanical power generation systems that utilize a thermodynamic process such as combustion to generate mechanical energy which is converted to electricity are well known in the art. For instance, a cellular phone may be powered from a generator connected to an automobile engine. However, traditional combustion-driven thermoelectromechanical power generation systems with a reasonable high power to weight ratio tend to be quite heavy and relatively non-portable. At smaller scales, e.g. lower weights, the power to weight ratio of these systems rapidly decreases. Thus, batteries are used as the power source in most portable electronic devices. In view of the foregoing, alternative light-weight, scaleable devices that efficiently convert thermally generated mechanical energy to electrical energy would be desirable.

SUMMARY OF THE INVENTION

This invention addresses the needs indicated above by providing generators with one or more transducers that use electroactive polymer films to convert thermally generated mechanical energy to electrical energy. The generators may include one or more transmission mechanisms that convert a portion of thermal energy generated from a heat source such as internal combustion, external combustion, solar energy, geothermal energy or waste heat, to mechanical energy that is used to drive the one or more transducers located in the generator. The energy received by the transducers may be converted to electrical energy by the transducers in conjunction with conditioning electronics located within the generator. One embodiment of the present invention provides an energy conversion device with two chambers, each chamber including a diaphragm transducer that may convert thermal energy to electricity using a thermodynamic cycle such as a Stirling gas cycle. The thermodynamic cycle of the energy conversion device may be reversed to provide cooling to an external device such as a semiconductor device.

One aspect of the present invention provides a generator for converting thermal energy to electrical energy. The generator may be generally characterized as including: 1) one or more transducers where each transducer comprises at least two electrodes and a polymer arranged in a manner which causes a change in electric field in response to a deflection applied to a portion of the polymer; 2) conditioning electronics connected to the at least two electrodes and designed or configured to add and remove electrical energy from the transducer; and 3) one or more transmission mechanisms designed or configured to receive thermal energy and to convert a portion of the thermal energy to mechanical energy, where the mechanical energy results in a deflection in the portion of the polymer. The transmission may convert thermal to mechanical energy using a gas. The gas may be generated from a boiling liquid as in a steam cycle, or it may be intrinsically a gas throughout the cycle. The gas may comprise one of helium, nitrogen, carbon dioxide, air, water, hydrocarbons, and halogenated hydrocarbons. A housing may enclose the one or more transducers, the conditioning electronics and the one or more transmission mechanisms.

In specific embodiments, the one or more transmission mechanisms may transfer the portion of the thermal energy via a mechanical linkage or the thermal energy may be converted to mechanical energy via a gas expansion. The one or more transmission mechanisms may comprise a hydraulic fluid where the hydraulic fluid is a boilable liquid. The one or more transmission mechanisms may comprises a heat exchange mechanism where the heat exchange mechanism transfers thermal energy via heat conduction, heat convection, radiation heat transfer or combinations thereof. The thermal energy received by the one or more transmission mechanisms may be solar energy or excess energy from an engine block.

In particular embodiments, the generator may include a combustion chamber for combustion of a fuel. The fuel may be a liquid fuel, a gaseous fuel, a gel fuel a solid fuel selected from the group consisting essentially of propane, butane, natural gas, hydrogen, kerosene, and gasoline. In addition, the combustion chamber may include 1) at least one fuel inlet for injecting the fuel into the combustion chamber and at least one exhaust outlet for ejecting a combustion product gas mixture from the combustion chamber, 2) a storage chamber for storing the fuel, 3) a pump for moving the fuel from the storage chamber to the combustion where the pump includes an electroactive polymer transducer, 4) a pump for moving external air to the combustion chamber where the pump includes an electroactive polymer transducer, and 5) an ignition device for initiating combustion in the combustion chamber.

In other embodiments, a portion of a surface bounding the combustion chamber may be the polymer where the combustion of the fuel results in a gas expansion, the gas expansion produces the deflection of the polymer portion of the surface bounding the combustion chamber. The polymer portion of the surface bounding the combustion chamber may expand to form one of a balloon-like shape, a hemispherical shape, cylinder shape, or a half-cylinder shape. A portion of a surface bounding the combustion chamber may be a piston where the combustion of the fuel moves the piston to generate mechanical energy.

In particular embodiments, the conditioning electronics may be designed or configured to perform one or more of the following functions: voltage step-up, voltage step-down and charge control where charge is added to, or removed from, the polymer using the charge control. The generator may also include 1) an electrical interface designed or configured to output the electrical energy, 2) one or more batteries designed or configured to store electrical energy removed from the one or more transducers, 3) one or more batteries used to increase the charge of the polymer and 4) a logic device where the logic device is designed or configured to control an addition of charge, a deletion of charge or a combination thereof on the polymer. The generator may also include one or more sensors connected to the generator where at least one of the one or more sensors is designed or configured to monitor a temperature or to monitor a pressure and where at least one of the one or more sensors is designed or configured to monitor at least one of the following quantities: the deflection in the portion of the polymer, a voltage in the portion of the polymer or a charge in the portion of the polymer.

Another aspect of the present invention may provide a generator for converting thermal energy to electrical energy. The generator may generally be characterized as including: 1) one or more transducer where each transducer may comprise at least two electrodes and a polymer arranged in a manner which causes a change in electric field in response to a deflection applied to a portion of the polymer; and 2) charge control circuitry connected to the at least two electrodes and designed or configured to remove electrical energy from the one or more transducers. The charge control circuitry may be designed to add charge to the one or more transducers. Further, the generator may also include a logic device where the logic device is designed or configured to determine an amount of charge to add or to delete from the polymer.

In particular embodiments, the generator may include: 1) step-down circuitry designed or configured to receive an input signal with an input voltage level and output an output signal with an output voltage level where the output voltage level is lower than the input voltage, 2) an electrical output interface designed or configured to output the output signal where the electrical output interface is connected to a battery, 3) one or more power conversion circuitry units and 4) one or more capacitors designed or configured to reduce a voltage level of a signal received by the one or more power conversion circuitry units. The output voltage level may be between about 3 Volts and about 400 Volts.

In particular embodiments, the step up circuitry may be designed or configured to receive an input signal with an input voltage level and output an output signal with an output voltage level where the input voltage level is lower than the output voltage level where the output signal is received by the charge control circuitry. The step-up circuitry may include an electrical input interface designed or configured to receive an input signal where the electrical input interface is connected to a battery. A voltage of the battery may be between about 1.5 and about 48 Volts.

Another aspect of the present invention provides an electroactive polymer energy conversion device for converting between thermal energy and electrical energy, the energy conversion device may be characterized as including: 1) two or more transducers where each transducer comprises at least two electrodes and a polymer arranged in a manner which causes a change in electric field in response to a deflection applied to a portion of the polymer; 2) two chambers enclosing a volume of a working fluid distributed between the chambers where the two chambers comprise: i) a first chamber with a first transducer and a first portion of the working fluid enclosed by the first chamber and ii) a second chamber with a second transducer and a second portion of the working fluid enclosed by the second chamber; 3) conditioning electronics connected to the at least two electrodes in each transducer and designed or configured to apply a charge to the transducers; and 4) one or more transmission mechanisms designed or configured to receive thermal energy.

In particular embodiments, the energy conversion device may also include: 1) a flow conduit designed or configured to allow the working fluid to flow between the first chamber and the second chamber, where the flow conduit may be designed or configured to have negligible heat transfer with the working fluid, or have significant heat transfer to affect thermal behavior of the working fluid as in a regenerator, 2) an insulation barrier designed or configured to minimize heat transfer between the first chamber and the second chamber, 3) a housing enclosing the two or more transducers, the two chambers, the conditioning electronics and the one or more transmission mechanisms and 4) an insulation layer attached to the polymer where the insulation layer is designed or configured to reduce heat transfer to the polymer where the insulation layer comprises one or more of a plurality of passive polymer layers, compliant inorganic materials, wetting liquids and combinations thereof.

In particular embodiments, the working fluid in the first chamber may be maintained at about a first temperature and the working fluid in the second chamber may be maintained at about a second temperature. The two or more transducers, the first chamber, the second chamber, the conditioning electronics and the one or more transmission mechanisms may be fabricated on a semiconductor, insulating, or metal substrate or a substrate made from combinations thereof. The energy conversion device may also include an insert located within the first chamber designed or configured to substantially conform to a contracted shape of the polymer of the first transducer and an insert located within the second chamber designed or configured to substantially conform to a contracted shape of the polymer of the second transducer.

In other embodiments, the thermal energy may be applied to the working fluid in the first chamber to expand the working fluid where the expansion of the working fluid deflects the polymer in the first chamber. The working fluid in the first chamber may be transferred to the second chamber via a flow conduit where the total volume of the working fluid in the first chamber, the second chamber and the flow conduit during the transfer remains substantially constant. The working fluid in the second chamber may be compressed at substantially constant temperature to cause heat to flow from the working fluid.

In other embodiments, the first transmission mechanism may be designed or configured to receive thermal energy and transfer a portion of thermal energy to the first chamber where the first transmission mechanism transfers the portion of the thermal energy via a fluid. The first transmission mechanism may receive thermal energy generated from an external heat source where the external heat comprises one of a solar heat source, an external combustion heat source, and a waste heat source. The first transmission mechanism may include a heat exchange mechanism where the heat exchange mechanism transfers a portion of thermal energy via at least one of heat conduction, heat convection, and radiation heat transfer.

In yet other embodiments, the polymer in the first chamber may be contracted to compress the working fluid in the first chamber where a portion of thermal energy generated during the compression of the working fluid in the first chamber is transferred from the working fluid via a heat exchanger. The working fluid may be a refrigerant of some type. The working fluid in the first chamber may be transferred to the second chamber via a flow conduit where a total volume of the working fluid in the first chamber, the second chamber and the flow conduit during the transfer remains substantially constant. The working fluid in the second chamber may be expanded resulting in working fluid cooling and heat transfer from the second chamber into the working fluid. The compression of the working fluid may convert a portion the working fluid to a liquid. The energy conversion device may include a first transmission mechanism designed or configured to cool an external device where the external device is a semiconductor device.

These and other features and advantages of the present invention will be described in the following description of the invention and associated figures.

BRIEF DESCRIPTION OF THE DRAWINGS

FIGS. 5H–5L illustrate top and side perspective views of a three-dimensional device for converting between electrical energy and mechanical energy in accordance with one embodiment of the present invention.

DETAILED DESCRIPTION OF THE PREFERRED EMBODIMENTS

Figure 1:
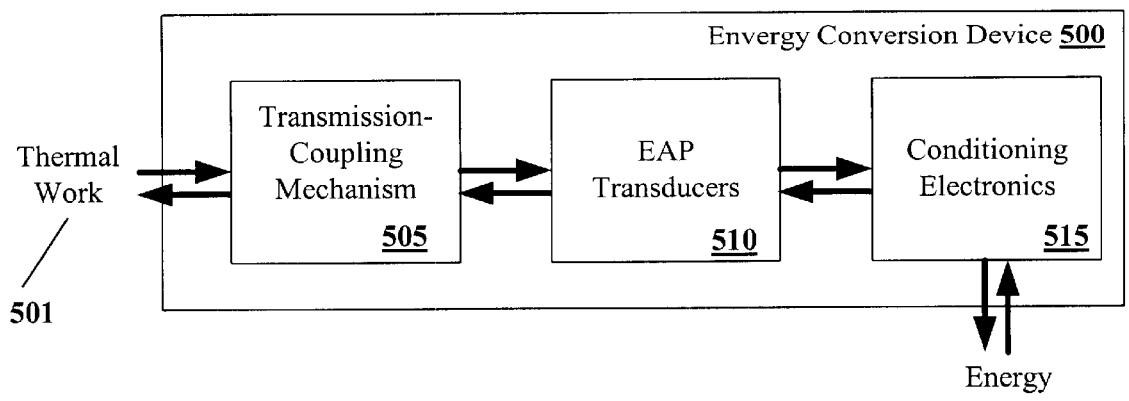
FIG. 1 is a block diagram of a energy conversion device including an electroactive polymer film of some type.

The present invention is described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. Overview

ElectroActive Polymers (EAP) may convert between electrical energy and mechanical energy in a bi-directional manner. Generators with one or more transducers that use electroactive polymer films may be designed to convert thermally generated mechanical energy to electrical energy. The generators may include one or more transmission mechanisms that convert a portion of thermal energy generated from a heat source such as internal combustion, external combustion, solar energy, geothermal energy or waste heat, to mechanical energy that is used to drive the one or more transducers located in the generator. The energy received by the transducers may be converted to electrical energy by the transducers in conjunction with conditioning electronics located within the generator. One embodiment of the present invention provides an energy conversion device with two chambers, each chamber including a diaphragm transducer that may convert thermal energy to electricity using a thermodynamic cycle such as a Stirling gas cycle.

The thermodynamic cycle of the energy conversion device may be reversed to provide cooling to an external device such as a semiconductor device. The electrical energy harvested in the manners described above may be used to power a number of electronic devices such as cell phones, radios, MP-3 players, personal digital assistants, locator beacons, mini-robots and microrobots, etc. Details of energy conversion devices, such as a thermal electric generator with a spherical EAP combustor, and energy conversion device components using electroactive polymers for performing thermal-mechanical-electric energy conversion, are described below.

In one aspect, the present invention relates to electroactive polymer transducers that comprise multiple active areas. The multiple active areas may be arranged on a single polymer. The ability to arrange multiple active areas on a single polymer allows for numerous transducer configurations. The multiple active areas may be used in a variety of ways. The ability to use these multiple active areas independently increases electroactive polymer flexibility in converting between thermal, electrical and mechanical energy and allows the polymers to be used in many new applications such as the energy conversion devices of the present invention.

For ease of understanding, the present invention is mainly described and shown by focusing on a single direction of energy conversion. More specifically, the present invention focuses on converting mechanical energy generated from a thermal into electrical energy, i.e., when a transducer is operating in a generator. The mechanical energy may be generated from a thermodynamic process such as gas expansion. However, in all the figures and discussions for the present invention, it is important to note that the polymers and devices may convert between electrical energy and mechanical energy bi-directionally and some transducers may be described as operating in an actuator. The conversion between electrical energy and mechanical energy allows work to be performed on a gas or a fluid. For instance, to remove heat from the fluid in a refrigeration cycle. Thus, any of the polymer materials, polymer configurations, transducers, and devices described herein are also a transducer for converting electrical energy to mechanical energy (an actuator). Similarly, any of the exemplary electrodes described herein may be used with a generator of the present invention. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

Thus, polymers and transducers of the present invention may be used as an actuator to convert from electrical to mechanical energy or a generator to convert from mechanical to electrical energy as part of the implementation of various thermodynamic cycles. For a transducer having a substantially constant thickness, one mechanism for differentiating the performance of the transducer, or a portion of the transducer associated with a single active area, as being an actuator or a generator is in the change in net area orthogonal to the thickness associated with the polymer deflection. For these transducers or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes, the transducer/active area is converting electrical to mechanical energy and acting as an actuator. The change in area in both cases corresponds to a reverse change in film thickness, i.e. the thickness contracts when the planar area expands, and the thickness expands when the planar area contracts. Both the change in area and change in thickness determine the amount of energy that is converted between electrical and mechanical. Since the effects due to a change in area and corresponding change in thickness are complementary, only the change in area will be discussed herein for sake of brevity. In addition, although deflection of an electroactive polymer will primarily be discussed as a net increase in area of the polymer when the polymer is being used in an actuator to produce mechanical energy, it is understood that in some cases (i.e. depending on the loading), the net area may decrease to produce mechanical work. Thus, devices of the present invention may include both actuator and generator modes, depending on how the polymer is arranged and applied.

2. General Structure of Energy Conversion Devices Employing Electroactive Polymers FIG. 1 is a block diagram of a energy conversion device 500 that may be used for harvesting electricity from thermally generated mechanical energy. The thermal energy 501 may be input into the generator 500 in some manner via one or more transmission coupling mechanisms 505 (See FIG. 3). Then, the thermal energy may be converted to mechanical energy via a thermodynamic process such as gas expansion or gas generation (for example, liquid boiling). A portion of the mechanical energy may be converted to electrical energy by one or more transducers employing an electroactive polymer (See FIGS. 4A–5O) in conjunction with conditioning electronics 515 (See FIGS. 6A–6E). Also, a portion of the mechanical energy may used to perform additional mechanical work such as pumping a fluid. The conditioning electronics 505 may transfer harvested electrical energy 516 to an electrical energy output. In some embodiments, the energy conversion device 500 may be operated in reverse to perform thermal work such as providing cooling to external device.

The thermal energy used to generate electricity may be provided from a number of sources. For instance, thermal energy 501 may be harvested from an environmental source such as solar energy or geothermal energy. The environmental energy 501 may be transferred by a heat exchange mechanism 505 via conduction, convention, radiation and combinations thereof to a working fluid such water or air. Next, a thermodynamic cycle may be applied to the working fluid (See FIG. 2B) in manner that generates mechanical work or energy. The mechanical energy may be harvested using one or more transducers 510 of the present invention to provide additional mechanical work 502 or may be converted into electricity 502. A choice of the working fluid as well as other components of the generator may depend on one or more operational and design parameters of the generator such as the chosen thermodynamic cycle, operational environment of the generator (e.g. commercial, residential, land, marine, portable, non-portable, etc.), size of the generator, cost requirements, durability requirements, efficiency requirements, temperature of the power source and power output requirements.

In other embodiments of the present invention, thermal energy 501 may be harvested from energy sources that are typically unused or wasted in operation of a particular device. The waste energy 501 may be harvested to generate electrical energy 502 or perform additional mechanical work 502. For instance, generators of the present invention may be located on or near the engine block, exhaust, or the radiator of an automobile to recover excess thermal energy generated during an internal combustion process implemented in pistons of the engine. Excess thermal energy from the engine 501 may be converted into electricity 502 using the electroactive polymer transducers 510. The energy harvested 502 using the conditioning electronics 515 may be used for many purposes such as to charge batteries that provide additional power to the automobile for locomotion or to power an energy conversion device 500 of the present invention that is used to provide air conditioning to a passenger compartment of the automobile.

In another embodiment, waste energy 501 may be recovered from residential sources. For instance, generators of the present invention may be located near a furnace, an oven or a hot-water heater. Excess thermal energy generated from the operation of these devices may be harvested by one or more energy conversion devices 500 and converted to electrical energy 502. The harvested electrical energy 502 may be fed into the residential power grid to power other residential appliances and reduce residential power consumption.

In yet another embodiments, an internal or external combustion source may be used to provide thermal energy 501 to the energy conversion devices of the present invention. The energy density of a hydrocarbon based fuels such as propane, butane, natural gas, gasoline and kerosene may be as high 20 times the energy density of commercially available batteries. Thus, hydrocarbon based fuels may be used with energy conversion devices 500 to fabricate lightweight, portable generators with a higher power/weight ratio than may be provided by batteries.

Figure 2A:
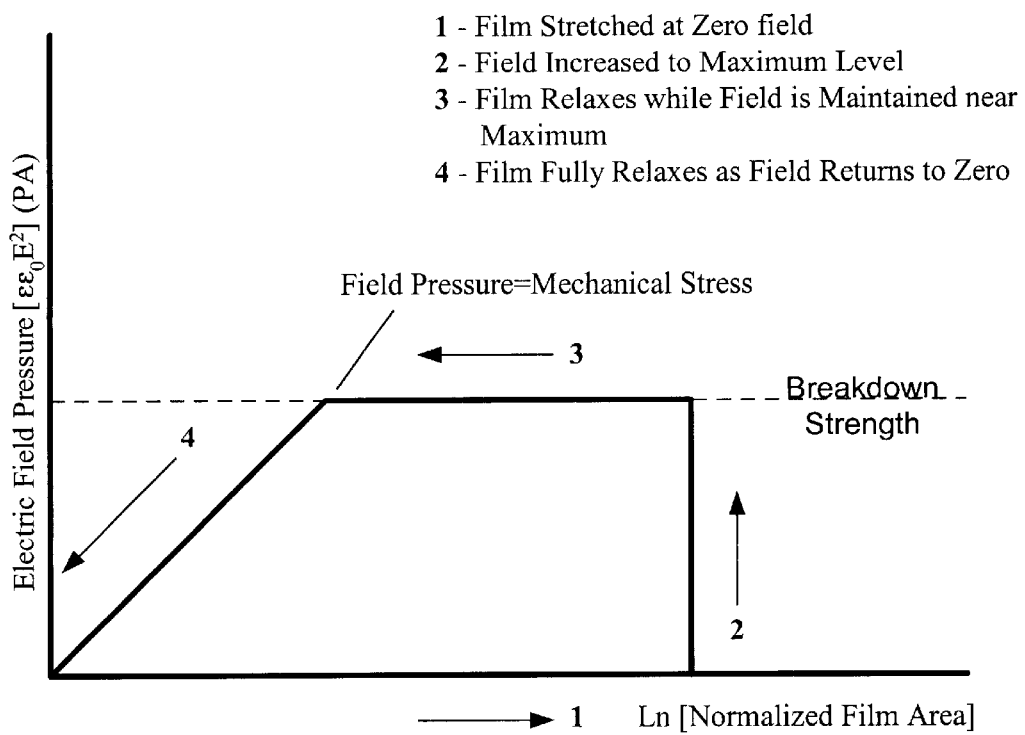
FIG. 2A illustrates a cycle for converting energy using an energy conversion device including an electroactive polymer film of some type.
Figure 3A:
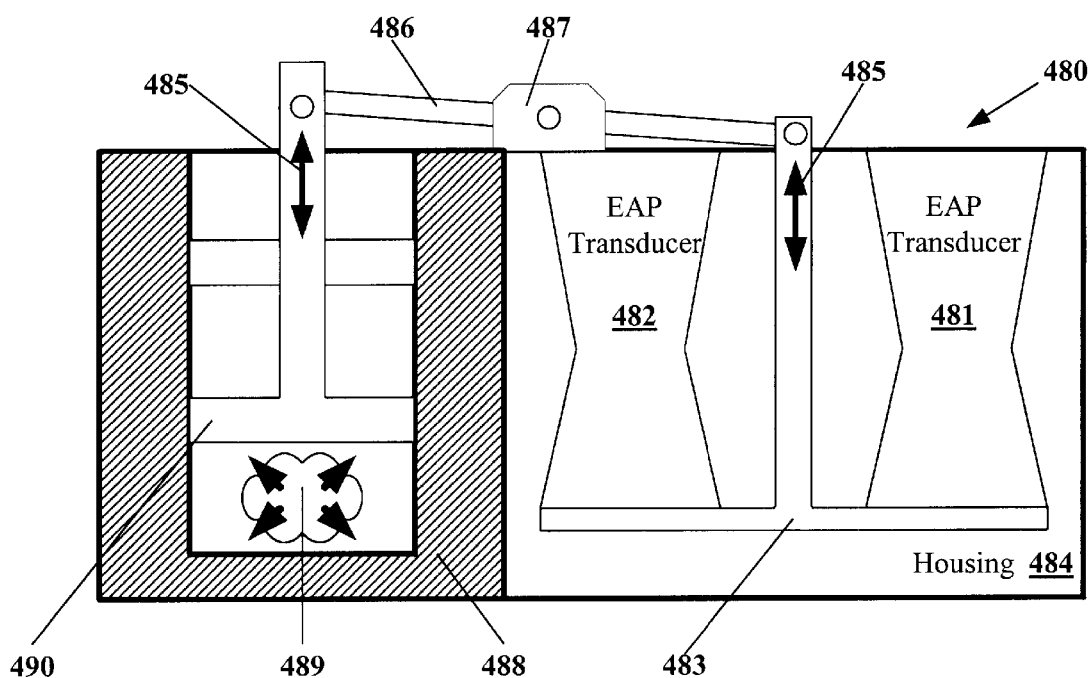
FIGS. 3A–3E are side views of a number of transmission coupling mechanisms for embodiments of the present invention.
Figure 3B:
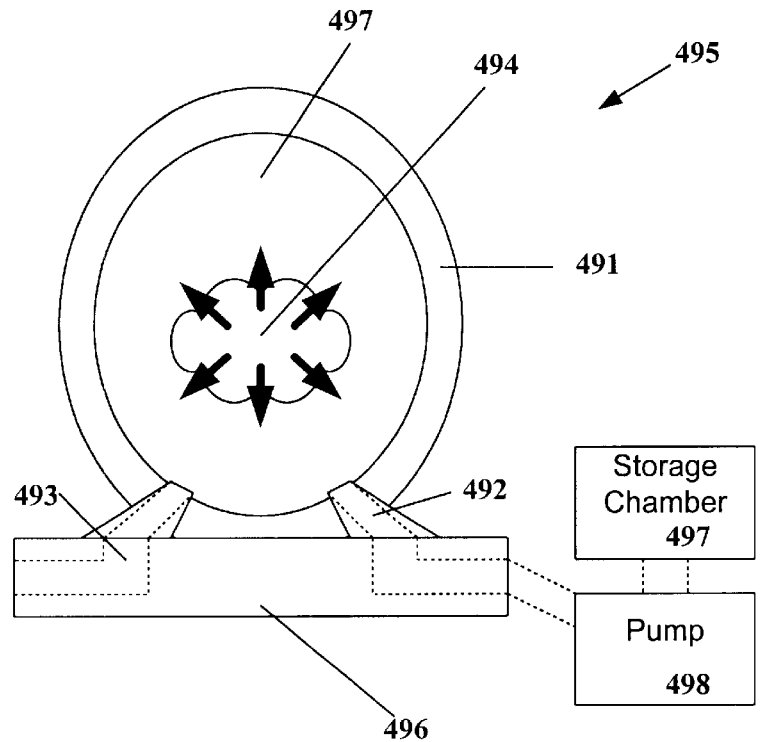

The internal combustion may occur directly inside an EAP transducer 510 (see FIG. 3B). The combustion process may expand gases within a EAP film arranged in a balloon-like shape or within a combustion chamber where one portion of a surface bounding the combustion chamber is an EAP film which acts as a diaphragm. The EAP film, as part of an associated transducer 510, may be designed such that the expansion of the combustion gases causes the EAP film to deflect. The deflection of the EAP film in conjunction with the conditioning electronics 515 may be used to harvest electrical energy 502 (See FIG. 2A).

Also, combustion processes may be implemented externally to an EAP transducer using a commercially available combustor. In one embodiment, using some type of transmission coupling mechanism 505, thermal energy from the combustor may be transferred to one or more chambers containing a working fluid. The chamber may be an EAP film arranged in a balloon-like shape or a chamber where one portion of a surface bounding the chamber is an EAP film which acts as a diaphragm. The working fluid may be a gas such as helium, nitrogen, carbon dioxide, air, water, hydrocarbons, and halogenated hydrocarbons or a boilable liquid such as water. Again, the EAP film, as part of an associated transducer 510, may be designed such that the expansion of the working fluid causes the EAP film to deflect. The deflection of the EAP film in conjunction with the condition electronics 515 may be used to harvest electrical energy 502.

FIG. 2A illustrates a cycle for converting energy using an energy conversion device including an electroactive polymer film of some type. When the energy conversion device is operated as a thermal-electric generator, a thermal energy source, e.g. environmental energy, waste energy, combustion energy or combination thereof, may be harvested using a thermodynamic process to generate mechanical energy which is converted to electricity. In general, the mechanical energy source is used to deflect or stretch the EAP polymer film in some manner (See FIGS. 4A–5Q). An energy conversion device of the present invention may be also used to perform thermal work. In this case, electrical energy may be used to deflect an EAP film. Mechanical work performed by the EAP film in the deflection process may be used to apply a thermodynamic process to a working fluid such as a refrigerant where thermal energy is removed from the working fluid during the thermodynamic process to provide cooling to an external device. To generate electrical energy over an extended time period or to perform thermal work, the EAP film may be stretched and relaxed over many cycles.

In FIG. 2A, one cycle of a polymer film stretching and relaxing to convert mechanical energy to electrical energy is shown. The cycle is for illustrative purposes only. Many different types of cycles may be employed by energy conversion devices of the present invention and the energy conversion devices are not limited to the cycle shown in FIG. 2B. In 1, the EAP polymer film is stretched with zero electric field pressure on the polymer. The stretching may result from a mechanical force applied to the film generated from an external energy source input into the energy conversion device. For example, a combustion process may be used to deflect and EAP film. In 2, the electric field pressure on the polymer film is increased to some maximum value. Conditioning electronics necessary to perform this function are described with reference to FIGS. 6A–6E. In this example, the maximum value of the electric field pressure is just below the electrical breakdown strength of the polymer. The break down strength may change with time at a rate that may depend on but is not limited to: 1) an environment in which an energy conversion device is used, 2) an operational history of the energy conversion device, and a type of polymer used in the energy conversion device.

In 3, the polymer relaxes while the electric field pressure is maintained near its maximum value. The relaxation process may correspond to an expanded working fluid cooling allowing the EAP film to relax or combustion products being removed from a balloon-shaped EAP transducer/combustor. As the polymer relaxes, the voltage of the charge on the polymer film is increased. The increase in charge's electrical energy, as indicated by its higher voltage, on the polymer film is harvested to generated electrical energy. In 4, the polymer film fully relaxes as the electric field pressure is reduced to zero and the cycle may be repeated. For instance, the cycle may be initiated when the working fluid is reheated and allowed to expand again or combustion is reinitiated in an EAP film transducer/combustor.

Transducers using an EAP film that are cycled in a manner such as described with reference to FIG. 2B, may have electrical energy added to EAP film at certain times in the cycle and may have electrical energy removed from the EAP film in other portions of the cycle. In general, generators of the present invention that employ EAP film transducers are designed such that the total electrical energy added to the EAP film is less than the total electrical energy removed from the EAP film during a cycle of some type. Also, generator components such as the conditioning electronics are designed to minimize electrical losses such that a net amount of electrical energy output from the generator is positive.

Figure 2B:
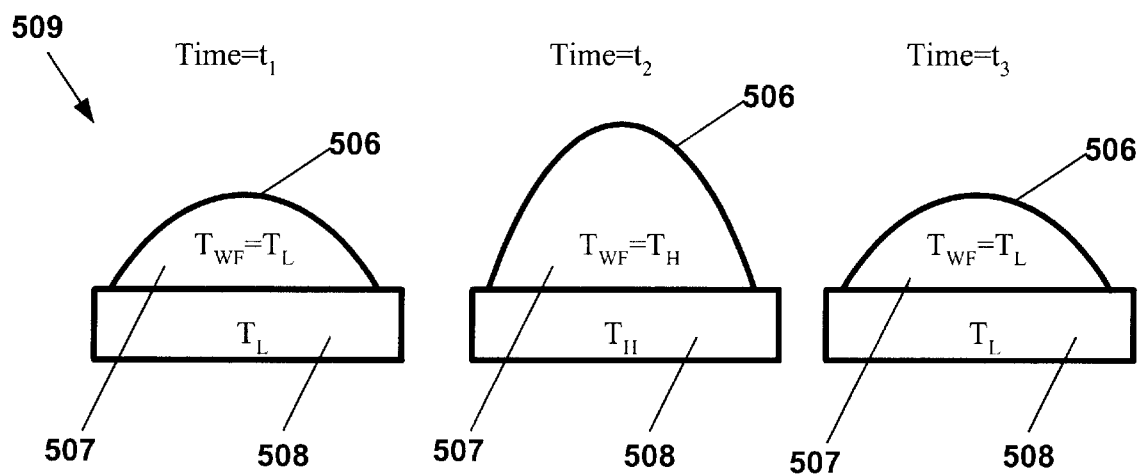
FIG. 2B illustrates a thermodynamic cycle for converting energy using a single chamber in an energy conversion device of the present invention.

FIGS. 2B illustrates a thermodynamic cycle for converting energy using a single chamber 509 in an energy conversion device of the present invention. As an example, the single chamber may be formed by securing an EAP film 506 in some shape across a thermally conducting plate 508 of some type and filling the plate with a working fluid 507 such as a gas or boilable liquid. A large variety of such chambers with many different shapes and sizes may be provided with energy conversion devices of the present invention and are not limited to the chamber 506 described in the example above. For instance, the EAP film 506 may be circular, ovular, triangular or rectangular in shape.

An example of a thermodynamic cycle that may be implemented with the device to harvest electrical energy is described as follows. At time $t_1$, the working fluid may be at a temperature $T_{WF}$, equal to a temperature of the thermally conducting plate, $T_L$. For example, $T_L$ may be the ambient temperature of the environment surrounding the single chamber 509. At a time just after $t_1$, the thermally conducting plate may be rapidly heated to a second temperature $T_H$ greater than $T_L$. The temperature of thermally conducting plate may be raised by heat source such as a combuster burning a fuel located beneath the plate. Between times $t_1$ and $t_2$, the EAP diaphragm 506 may expand until the temperature of the working fluid, $T_{WF}$, equalizes with the $T_H$. The amount of expansion of the EAP diaphragm 506 may depend on a number parameters, such as a number of layers used in the EAP diaphragm, a type of material used for the EAP diaphragm, an initial charge placed on the EAP diaphragm, a type of working fluid, an initial strain placed on the EAP diaphragm, the temperature $T_H$ and an ambient pressure outside of the EAP diaphragm.

At time $t_2$, a charge may be placed on the EAP diaphragm by conditioning electronics connected to the diaphragm. At a time just after $t_2$, the heat source may be removed and thermally conducting plate 508 may be allowed to cool to temperature $T_L$. At a time $t_3$, the working fluid 507 and the thermally conducting plate 508 may have equalized at temperature $T_L$ and the diaphragm may have relaxed to its initial shape at $t_1$. Between times $t_2$ and $t_3$, as the diaphragm 506 relaxes to its initial state, electrical energy may be harvested from the diaphragm as it relaxes. After $t_3$, the thermodynamic cycle may repeated to generate electrical energy.

Figure 2C:
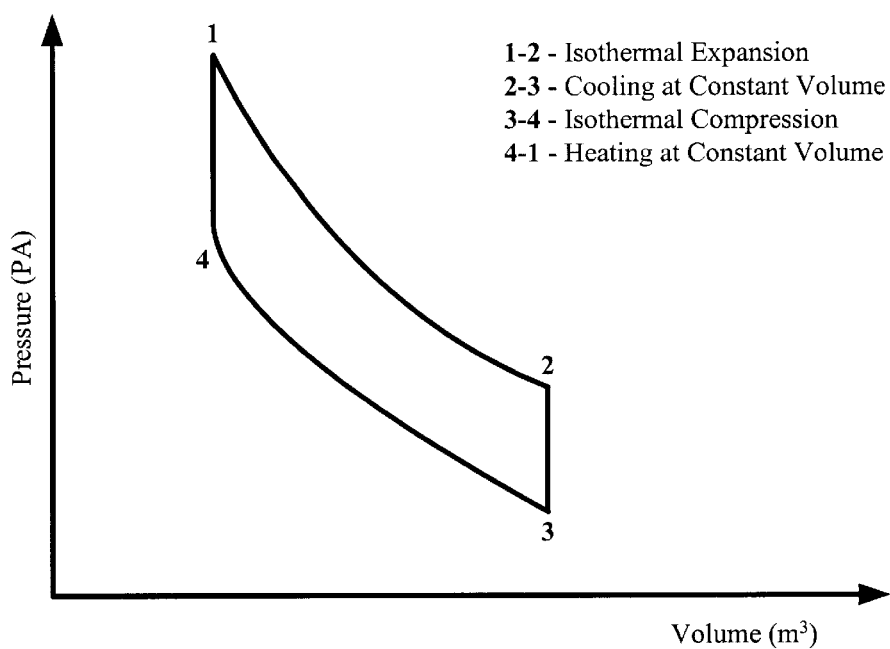
FIGS. 2C and 2D illustrate a thermodynamic cycle for converting energy using a multiple chamber in an energy conversion device of the present invention.
Figure 2D:
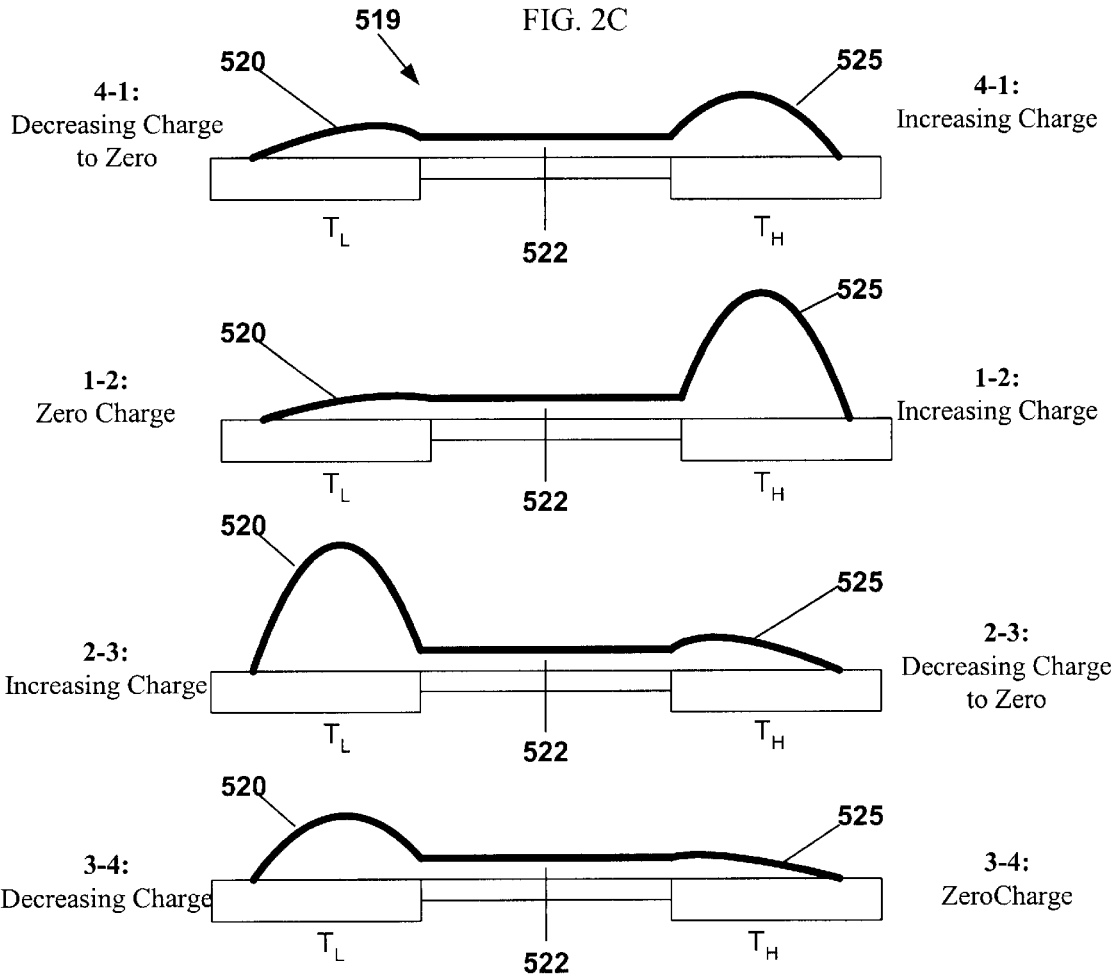

FIGS. 2C and 2D illustrate a thermodynamic cycle for converting energy using a multiple chambers in an energy conversion device of the present invention. In FIG. 2C, a first chamber partially bounded by EAP diaphragm 520 and a second chamber bounded by EAP diaphragm 525 is shown. The two chambers are connected via a flow conduit 522. The flow conduit may a simple conduit that allows gas to pass between the two chambers, or it may employ thermal aspects such as a regenerator flow conduit that increases the temperature of an initially cool gas when it flows out of one end of the conduit and decreases the temperature of an initially hot gas when it exits the opposite end of the conduit. Energy conversions devices of the present invention may employ a plurality of chambers where each chamber includes an EAP diaphragm of a particular size, shape and material and a working fluid of some type. Combinations of the plurality of chambers, such as chamber pairs, may be connected in some manner via one or more flow conduits to allow the working fluid to move between the connected chambers. Non-connected chambers on the same device may employ different working fluids. For instance, on a single energy conversion device one pair of chambers may use water to harvest electricity from an external thermal source. A second pair of chambers on the same device may use a refrigerant and electricity generated from the first chamber pair to provide cooling to an external device.

FIGS. 2C and 2D show the implementation of a thermodynamic cycle for converting energy using an energy conversion device with two-chambers. The thermodynamic cycle, generally referred to as a Stirling cycle, is an idealized thermodynamic process in the sense it is designed to minimize entropic losses. The cycle is for illustrative purposes as many types of thermodynamic cycles may be implemented with the energy conversion devices of the present invention. In state 1, the working fluid in contact with diaphragm 525 may be at a relatively high pressure. Between states 1 and 2, the working fluid in contact with diaphragm 525 may be isothermally expanded at temperature, $T_H$. Charge may be increased to diaphragm 525 to aid in the expansion process. The flow conduit 522 may be a regenerator. Between 2–3, the diaphragms 520 and 525 may be used to pull the working fluid through the flow conduit and toward diaphragm 520 while a constant volume of the system including the chamber and the flow conduit is maintained as the working fluid is cooled to temperature $T_L$ in the flow conduit. Charge on diaphragm 525 may be decreased and charge on diaphragm 520 may be increased during 2–3 to help move the working fluid between the diaphragms. Between 3–4, the diaphragm 520 may isothermally compress the working fluid at $T_L$. The charge on diaphragm 520 may be decreased to carry out the compression. From 4-1, the working fluid may be moved through the flow conduit 522 while maintaining a constant volume. While in the flow conduit, the working fluid may be reheated to $T_H$. During 4-1, the charge on diaphragm 520 may be decreased and the charge on diaphragm 525 may be increased to move the working fluid between the diaphragms.

When the thermodynamic cycle in FIG. 2C has been followed, the working fluid does net work on its surroundings since the P-V diagram encloses an area in the closed cycle. In this example, the surrounding of the working fluid are the diaphragms 520 and 525. As described with reference to FIG. 2A, a portion of the work generated during the deflection of diaphragms 520 and 525 may be harvested as electrical energy.

The Stirling cycle in FIG. 2C may also be run in reverse (e.g. 1, 4, 3, 2) to provide Stirling refrigeration. In one embodiment, electrical energy may be supplied to the diaphragms 520 and 525 such that the Stirling refrigeration process is followed and thermal energy is moved from the cold side to the hot side by the working fluid. In this example, an energy conversion device implementing the Stirling refrigeration cycle may be used to cool an external device such as a semi-conductor device or a chamber for maintaining a food product or a drink at a temperature below ambient temperature. In some embodiments, different working fluids may be used for energy conversion devices performing refrigeration versus power generation. However, in other embodiments, a single working fluid employed in a diaphragm arrangement of some type may be used to perform both power generation and refrigeration at different times.

To implement the Stirling cycle described above, a charge profile consisting of an amount of charge on each diaphragm, 520 and 525 as a function of time must be developed. In general, a charge profile may be needed to implement many types of thermodynamic cycle and is not limited to Stirling cycles. The diaphragm charge profiles may result from solving a complex control problem. Optimum charge profiles may depend on a number of parameters such as a type of working fluid, a type of diaphragm which may consist of multiple layers of EAP materials and non-EAP materials, ambient conditions, operating temperatures, a size of the diaphragms and a shape of a diaphragm. The optimum charge profiles may change with time as ambient conditions in the environment in which the energy conversion device is operating change or as the material properties of the diaphragms change with time.

The charge control on the diaphragms may be implemented by the conditioning electronics (as described with reference to FIG. 1) following one or more charge profiles. In some embodiments, charge control circuitry, which may be packaged with the conditioning electronics, may be operated by a logic device of some type such as a microprocessor or a microcontroller. The logic device may execute control algorithms of varying complexity. The control algorithms may dynamically change the charge on a given EAP diaphragm according to quantities measured by sensors located within the energy conversion device. For example, the sensors may measure such quantities as a pressure and temperature of a working fluid, a temperature of a thermal source, a deflection distance of an EAP diaphragm, a voltage on an EAP diaphragm, a resistance of an EAP diaphragm, a charge on an EAP diaphragm, or a noise output from the generator or a power output of the generator.

The logic device may be programmed to execute a specific control algorithm, or it may be programmed to search for improved algorithms starting from an initial estimate of the charge profile. For example, the logic device may first execute cycles based on an initial estimate of the charge profile and measure the generator power output. The logic device may then vary the profile according to local (small variations) or global (large variations) search routines to execute other charge profiles while measuring generator output using the varied charge profiles. In this way the logic device can identify charge profiles with higher generator outputs than the initial estimate. Local and global search routines may be used to improve or optimize performance based on generator power output, or based on other performance parameter or combinations of parameters including, but not limited to thermodynamic efficiency, total system efficiency, and noise output.

The logic devices may also allow energy conversion devices to implement different thermodynamic cycles. For example, for an energy conversion device that performs both refrigeration and power generation, the optimum thermodynamic cycle for refrigeration may be different than the optimum thermodynamic cycle for power generation. Thus, different thermodynamic cycles may be executed by the logic device. Further, the present invention is not limited to a single logic device used to perform charge control operations. The single logic device may perform other functions such as communication with a remote device or the functions may be performed by multiple logic devices included in the energy conversion device.

In the previous example described with reference to FIG. 2C, an energy conversion device is described following an idealized Stirling cycle. In application, thermal, viscoelastic and electronic losses may cause deviations from the Stirling cycle reducing an amount of power which may be recovered from the energy conversion device. These types of losses as well as other losses also occur with traditional piston driven systems such as a double-cylinder Stirling engine. For instance, motion restrictions from a kinematic set-up, such as from a use of crankshafts or from a dynamic set-up, such as in free-piston resonating Stirling engines, prevent a sharp change in processes at points 1, 2, 3 and 4 in FIG. 2C. Deviations from the idealized Stirling cycle incur irreversible thermodynamic losses and contribute to the lower efficiency of practical devices. An advantage of the EAP double-diaphragm equivalent of the double cylinder Stirling engine is that it does not have the fundamental motion restrictions during the cycle because the motion of the diaphragms are electronically controlled and the diaphragms have very low inertia. The electronic control of the diaphragms may allow the energy conversion devices of the present invention to more closely approximate a Stirling cycle than a traditional piston driven device. In addition, another advantage of the EAP diaphragm approach is that the diaphragms do not incur the frictional losses associated with moving pistons and crankshafts and the associated lubrication requirements associated with minimizing such losses. Thus, when following a particular thermodynamic cycle such as a Stirling cycle, energy conversion devices of the present invention may be more efficient than traditional engines using pistons.

Figure 3C:
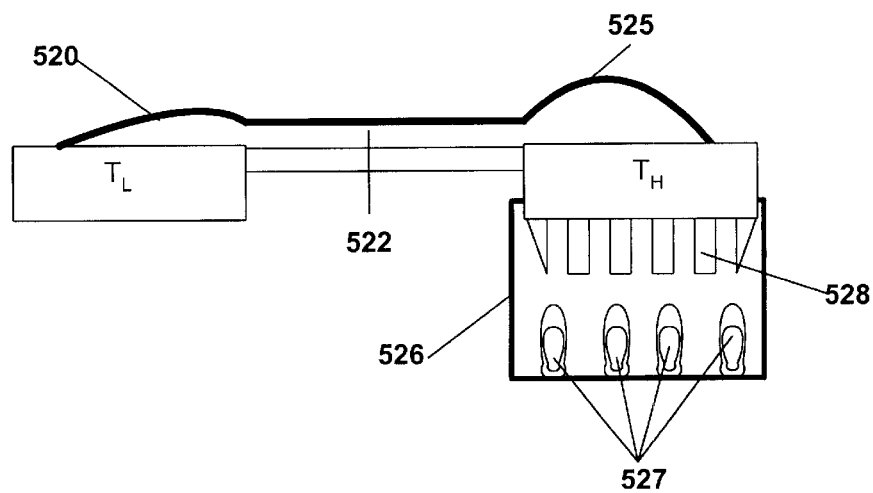
Figure 3D:
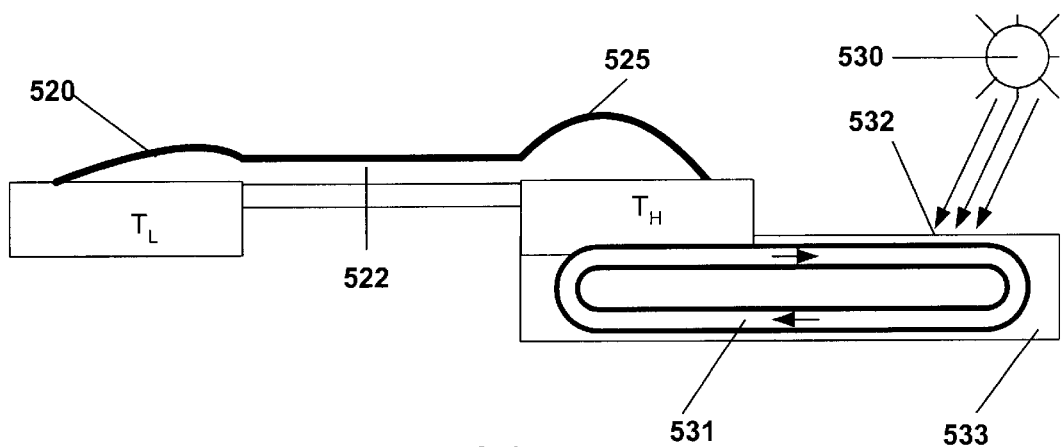
Figure 3E:
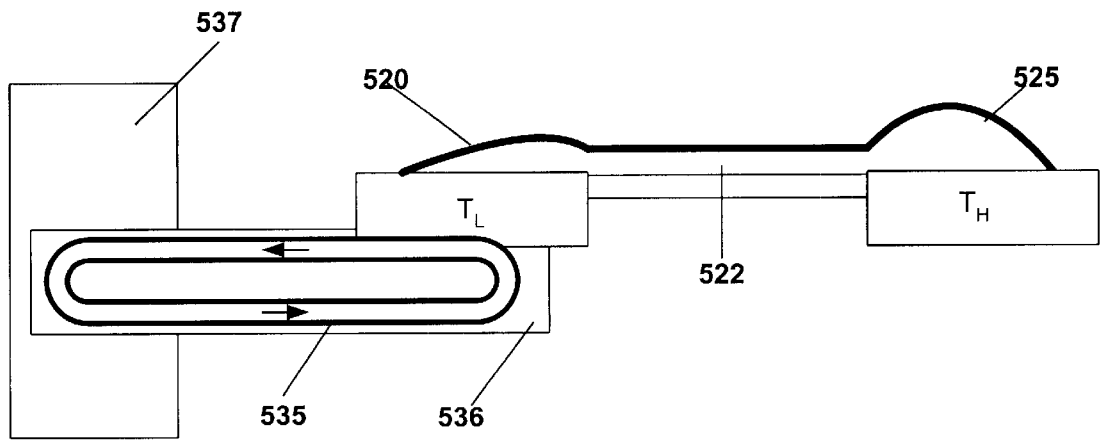

FIGS. 3A–3E are side views of a number of transmission mechanisms for embodiments of the present invention. In FIGS. 3A–3D, a thermal energy source is used to produce a mechanical deflection of an EAP film transducer within an energy conversion device of the present invention. In FIG. 3E, thermal work is performed by an EAP film transducer of the present invention to cool an external device.

In FIG. 3A, a piston 490 in a cylinder 488 is driven up and down in direction 485. The piston 485 may be driven up in the cylinder 488 by the combustion of a fuel of some type 489. The piston may be connected to a crank-shaft of some type via a mechanical linkage that allows a portion of the upward momentum of the piston to be transferred downward to compress a pre-combusted fuel mixture. A portion of the up and down motion of the piston 490 may be transferred via a mechanical linkage, comprising a support member 486, a pivot and an anchor 487 attached to a housing 487, to support member 483. As a result of the connection to the mechanical linkage, the support member 483 may move up and down in direction 485. The up and down motion of the support member 483 may stretch and relax two EAP film transducers 481 and 482. The relaxation of the EAP film transducers may be used to drive the piston 490 downward to compress a pre-combustion fuel mixture or to do other mechanical work. Thus, a portion of the energy harvested from the EAP film transducers, 481 and 482, may be mechanical energy. As described with reference to FIG. 2A, charge may be placed on the EAP film transducers, 481 and 482, during their deflection to allow electrical energy to be harvested from the transducers. The electrical energy harvesting process may be repeated in a cyclic manner as combustion is repeatedly initiated in the cylinder 488.

In this embodiment, the motion of the polymer films 481 and 482 has a 1:1 correspondence to the motion of the support member 483 where the direct force is applied. That is, the polymers 481 and 482 displace one millimeter for each millimeter of displacement at the point on support member 483 where the direct force 485 is applied. The present invention is not limited to the mechanical linkages such as the support members 483, 486 and 487, and the electroactive polymer film arrangement in transmission mechanism 480. Transmission mechanisms using different mechanical linkages may be connected to electroactive polymer film arrangements with a plurality of transducers with different orientations and using various attachment schemes.

FIG. 3B is a side view of a heat driven generator 495 employing a spherical combustion chamber 497 formed from a balloon-shaped EAP film diaphragm 491 mounted to a support plate 496. When combustion is initiated in the chamber 497, a combination of a fuel and an oxidizer is ignited. An ignition device (not shown) such as a spark plug may be used to initiate the combustion process. The fuel may be injected through a fuel inlet 492 into the combustion chamber 497. An oxidizer such as air may be drawn into the combustion chamber via inlet 493 which may also server as an exhaust outlet for combustion products. Inlet 493 may include an actuated valve (not shown) to open and close inlet 493 at the appropriate times in the cycle. In some embodiments the actuated valve may include an EAP film transducer.

The fuel may be stored in a storage chamber 497. In some embodiments, a pump 498 of some type, which may utilize an EAP film transducer, may be used to transfer the fuel from the storage chamber 497 to the fuel inlet 492. The pump 498 may also be used to move external air or a stored oxidizer to the combustion chamber. The fuel may be stored in a liquid, gaseous, solid or gel-state. Some types of fuels that may be used with generators of the present invention include hydrocarbon based fuels such as propane, butane, natural gas, hydrogen, kerosene, and gasoline, jet fuel, diesel, coal-derived fuels, biomass and other hydrocarbon fuels.

During combustion of the fuel and the oxidizer, gas expansion expands the diaphragm 491 outwards increasing its diameter. After a certain amount of time, combustion products may be vented from the combustion chamber 497 via inlet 493 or another inlet and the combustion process may be reinitiated. As previously described, mechanical work performed on the diaphragm 491 by the gas expansion may be harvested to generate electricity.

The balloon shaped diaphragm 491 as well as other diaphragms used in the present invention may be constructed of many layers. For instance, in one embodiment, the diaphragm may include an outer cooler layer of elastomer, an intermediate polymer buffer layer and an inner compliant thermal shield layer. The outer layer, intermediate layer and thermal shield layer may also include multiple material layers. For instance, the outer layer and the intermediate layer may include a plurality of EAP film layers and non-EAP film layers.

When needed, the thermal shield may be used to reduce heat transfer to the plurality of EAP film layers in an EAP diaphragm during combustion. For instance, low-temperature combustion may not require a thermal shield. Further, some EAP materials may operate at the temperatures necessary for combustion (the temperature of the combustion chamber walls may be substantially lower than the gas combustion temperatures, as it is with conventional metal piston-cylinder engines). The thermal shield may include compliant inorganic materials such as hair-like structures on the polymer. The hair-like structures may be composed of an insulating material such as silica fibers or fiberglass. In addition, prior to combustion, a wetting liquid such as water or oil may be used on the interior of the combustion chamber to lessen heat transfer to the diaphragm 491.

The present invention is not limited to spherically shaped combustion chambers such as 497. A combustion chamber may be enclosed by a surface including a portion bounded by an EAP material and a non-EAP material. For each chamber, the EAP material portion of the surface and the non-EAP material portion of the surface may vary in shape and size. In FIG. 3B, a large portion of the combustion chamber surface, which comprises the support plate 496 (non-EAP material) and the spherical diaphragm 491 (EAP material), is bounded by the spherical diaphragm 491. As other examples, a cylindrically shaped, hemispherically shaped, half-cylindrically shaped, rectangular box shaped chambers may be used for combustion where only a top surface of the chamber is bounded by an EAP material and the rest of the surface of the chamber bounded by a non-EAP material. For these examples, the portion of EAP material bounding the surface of the combustion chamber relative to the portion of non-EAP material bounding the surface of the combustion chamber may be lower than for the spherically shaped combustion chamber described in FIG. 3B.

The present invention is not limited to combustion chambers with the shapes described above. Also, the shapes described above for the combustion chambers may be used as chambers for gas expansion where combustion does not take place (See FIG. 7B). For instance, in FIG. 3B, a working fluid inside chamber 497 may be expanded by applying heat to the working fluid from an external heat source. The heat may cause the working fluid to expand causing the spherical diaphragm 491 to inflate in a balloon like manner. As described above, the deflection of the spherical diaphragm may be converted to electrical energy.

In FIG. 3C, the hot side (at $T_H$) of the energy conversion device described with reference to FIGS. 2C and 2D is heated by combustion sources 527 in the combustor 526. Heat generated from the combustion of a fuel may be transferred via a heat exchange mechanism to the hot side of the energy conversion device. In one embodiment, the heat exchange mechanism 528 includes a number of metallic vanes that trap convective heat rising from the combustion sources 527. The trapped heat may be transferred via conduction or some other heat transfer mechanism to a working fluid under diaphragm 525 which is expanded at $T_H$. When the working fluid is transferred from diaphragm 520 to diaphragm 525, thermal energy from the combustor 526 may also be used to raise the temperature within the flow conduit 522 to $T_H$.

In FIG. 3D, the hot side (at $T_H$) of the energy conversion device described with reference to FIGS. 2C and 2D is heated by a solar heat source 530. The solar energy may be absorbed by a black coated surface 532. The solar energy absorbed by surface 532 may be transferred via a heat exchange mechanism to the hot side of the energy conversion device. In one embodiment, the heat exchange mechanism 533 includes a circulating fluid of some type which transfers a portion of the solar thermal energy to the hot side of the energy conversion device. The heat carried by the circulating fluid 531 may be transferred via conduction or some other heat transfer mechanism to a working fluid under diaphragm 525 which is expanded at $T_H$. When the working fluid is transferred from diaphragm 520 to diaphragm 525, thermal energy from the solar heat source may also be used to raise the temperature within the flow conduit 522 to $T_H$. A circulating fluid heat exchange mechanism of this type may also be used in embodiments where the thermal energy source is a geothermal energy source.

In FIG. 3E, the energy conversion device described with respect to FIGS. 2C and 2D is operated to provide refrigeration. In FIG. 3E, the temperature under diaphragm 520 on a cool portion of the device is maintained at $T_L$. In one embodiment, a fluid 535 in a heat exchange mechanism 536 is circulated below the cool side. The cooled fluid 535 is circulated near a surface 537 to cool the surface. The energy conversion devices of the present invention may be manufactured on a semi-conductor substrate, a metal substrate and thermally insulating substrate or combinations thereof. Thus, for instance, the surface 537 may be a surface on a semi-conductor device. In some embodiments, the cooled fluid 535 may be used to cool an enclosed volume. The enclosed volume may contain a drink or a food product. When the energy conversion device is fabricated as part of a semi-conductor device, the enclosed volume may contain a biological sample being analyzed by the semi-conductor device.

3. General Structure of Electroactive Polymers

Figure 4A:
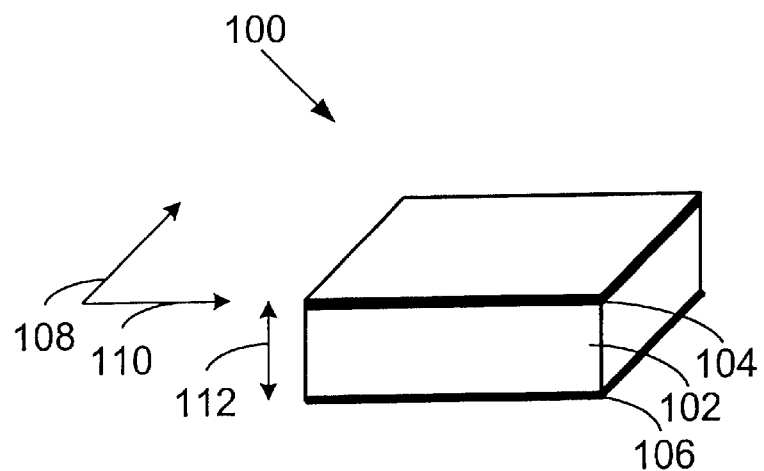
FIGS. 4A and 4B illustrate a top perspective view of a transducer before and after application of a voltage in accordance with one embodiment of the present invention.

The transformation between electrical and mechanical energy in devices of the present invention is based on energy conversion of one or more active areas of an electroactive polymer (EAP). Electroactive polymers deflect when actuated by electrical energy. To help illustrate the performance of an electroactive polymer in converting electrical energy to mechanical energy, FIG. 4A illustrates a top perspective view of a transducer portion 100 in accordance with one embodiment of the present invention. The transducer portion 100 comprises an electroactive polymer 102 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 104 and 106 are attached to the electroactive polymer 102 on its top and bottom surfaces, respectively, to provide a voltage difference across a portion of the polymer 102. Polymer 102 deflects with a change in electric field provided by the top and bottom electrodes 104 and 106. Deflection of the transducer portion 100 in response to a change in electric field provided by the electrodes 104 and 106 is referred to as actuation. As polymer 102 changes in size, the deflection may be used to produce mechanical work.

Figure 4B:
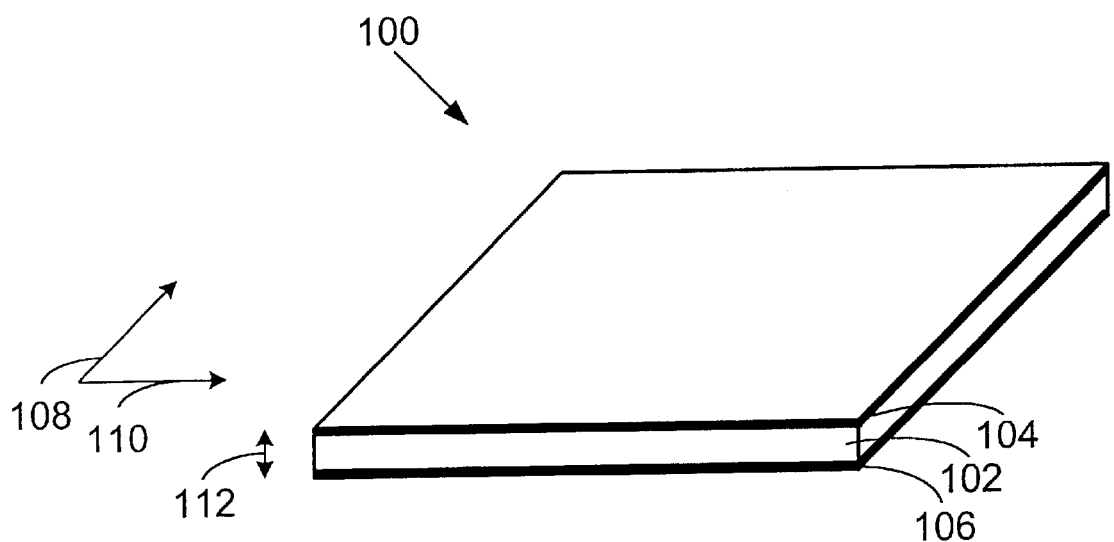

FIG. 4B illustrates a top perspective view of the transducer portion 100 including deflection in response to a change in electric field. In general, deflection refers to any displacement, expansion, contraction, torsion, linear or area strain, or any other deformation of a portion of the polymer 102. The change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 and an expansion force on polymer 102 in planar directions 108 and 110, causing polymer 102 to compress between electrodes 104 and 106 and stretch in the planar directions 108 and 110.

In some cases, electrodes 104 and 106 cover a limited portion of polymer 102 relative to the total area of the polymer. This may be done to prevent electrical breakdown around the edge of polymer 102 or to achieve customized deflections for one or more portions of the polymer. As the term is used herein, an active area is defined as a portion of a transducer comprising polymer material 102 and at least two electrodes. When the active area is used to convert electrical energy to mechanical energy, the active area includes a portion of polymer 102 having sufficient electrostatic force to enable deflection of the portion. When the active area is used to convert mechanical energy to electrical energy, the active area includes a portion of polymer 102 having sufficient deflection to enable a change in electrostatic energy. As will be described below, a polymer of the present invention may have multiple active areas. In some cases, polymer 102 material outside an active area may act as an external spring force on the active area during deflection. More specifically, polymer material outside the active area may resist active area deflection by its contraction or expansion. Removal of the voltage difference and the induced charge causes the reverse effects.

Electrodes 104 and 106 are compliant and change shape with polymer 102. The configuration of polymer 102 and electrodes 104 and 106 provides for increasing polymer 102 response with deflection. More specifically, as the transducer portion 100 deflects, compression of polymer 102 brings the opposite charges of electrodes 104 and 106 closer and the stretching of polymer 102 separates similar charges in each electrode. In one embodiment, one of the electrodes 104 and 106 is ground.

In general, the transducer portion 100 continues to deflect until mechanical forces balance the electrostatic forces driving the deflection. The mechanical forces include elastic restoring forces of the polymer 102 material, the compliance of electrodes 104 and 106, and any external resistance provided by a device and/or load coupled to the transducer portion 100, etc. The deflection of the transducer portion 100 as a result of the applied voltage may also depend on a number of other factors such as the polymer 102 dielectric constant and the size of polymer 102.

Electroactive polymers in accordance with the present invention are capable of deflection in any direction. After application of the voltage between electrodes 104 and 106, polymer 102 expands (stretches) in both planar directions 108 and 110. In some cases, polymer 102 is incompressible, e.g. has a substantially constant volume under stress. For an incompressible polymer 102, polymer 102 decreases in thickness as a result of the expansion in the planar directions 108 and 110. It should be noted that the present invention is not limited to incompressible polymers and deflection of the polymer 102 may not conform to such a simple relationship.

Application of a relatively large voltage difference between electrodes 104 and 106 on the transducer portion 100 shown in FIG. 4A will cause transducer portion 100 to change to a thinner, larger area shape as shown in FIG. 4B. In this manner, the transducer portion 100 converts electrical energy to mechanical energy. The transducer portion 100 may also be used to convert mechanical energy to electrical energy.

FIGS. 4A and 4B may be used to show one manner in which the transducer portion 100 converts mechanical energy to electrical energy. For example, if the transducer portion 100 is mechanically stretched by external forces to a thinner, larger area shape such as that shown in FIG. 4B, and a relatively small voltage difference (less than that necessary to actuate the film to the configuration in FIG. 4B) is applied between electrodes 104 and 106, the transducer portion 100 will contract in area between the electrodes to a shape such as in FIG. 4A when the external forces are removed. Stretching the transducer refers to deflecting the transducer from its original resting position—typically to result in a larger net area between the electrodes, e.g. in the plane defined by directions 108 and 110 between the electrodes. The resting position refers to the position of the transducer portion 100 having no external electrical or mechanical input and may comprise any pre-strain in the polymer. Once the transducer portion 100 is stretched, the relatively small voltage difference is provided such that the resulting electrostatic forces are insufficient to balance the elastic restoring forces of the stretch. The transducer portion 100 therefore contracts, and it becomes thicker and has a smaller planar area in the plane defined by directions 108 and 110 (orthogonal to the thickness between electrodes). When polymer 102 becomes thicker, it separates electrodes 104 and 106 and their corresponding unlike charges, thus raising the electrical energy and voltage of the charge. Further, when electrodes 104 and 106 contract to a smaller area, like charges within each electrode compress, also raising the electrical energy and voltage of the charge. Thus, with different charges on electrodes 104 and 106, contraction from a shape such as that shown in FIG. 4B to one such as that shown in FIG. 4A raises the electrical energy of the charge. That is, mechanical deflection is being turned into electrical energy and the transducer portion 100 is acting as a generator.

In some cases, the transducer portion 100 may be described electrically as a variable capacitor. The capacitance decreases for the shape change going from that shown in FIG. 4B to that shown in FIG. 4A. Typically, the voltage difference between electrodes 104 and 106 will be raised by contraction. This is normally the case, for example, if additional charge is not added or subtracted from electrodes 104 and 106 during the contraction process. The increase in electrical energy, U, may be illustrated by the formula $U=0.5\ Q^2/C$, where Q is the amount of positive charge on the positive electrode and C is the variable capacitance which relates to the intrinsic dielectric properties of polymer 102 and its geometry. If Q is fixed and C decreases, then the electrical energy U increases. The increase in electrical energy and voltage can be recovered or used in a suitable device or electronic circuit in electrical communication with electrodes 104 and 106. In addition, the transducer portion 100 may be mechanically coupled to a mechanical input that deflects the polymer and provides mechanical energy.

The transducer portion 100 will convert mechanical energy to electrical energy when it contracts. Some or all of the charge and energy can be removed when the transducer portion 100 is fully contracted in the plane defined by directions 108 and 110. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 100 when operating as a generator depends on any electrical and mechanical loading as well as the intrinsic properties of polymer 102 and electrodes 104 and 106.

In one embodiment, electroactive polymer 102 is pre-strained. Pre-strain of a polymer may be described, in one or more directions, as the change in dimension in a direction after pre-straining relative to the dimension in that direction before pre-straining. The pre-strain may comprise elastic deformation of polymer 102 and be formed, for example, by stretching the polymer in tension and fixing one or more of the edges while stretched. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. In another embodiment, the pre-strain is elastic. After actuation, an elastically pre-strained polymer could, in principle, be unfixed and return to its original state. The pre-strain may be imposed at the boundaries using a rigid frame or may also be implemented locally for a portion of the polymer.

In one embodiment, pre-strain is applied uniformly over a portion of polymer 102 to produce an isotropic pre-strained polymer. By way of example, an acrylic elastomeric polymer may be stretched by 200 to 400 percent in both planar directions. In another embodiment, pre-strain is applied unequally in different directions for a portion of polymer 102 to produce an anisotropic pre-strained polymer. In this case, polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 108 of transducer portion 100 can be enhanced by exploiting large pre-strain in the perpendicular direction 110. For example, an acrylic elastomeric polymer used as the transducer portion 100 may be stretched by 100 percent in direction 108 and by 500 percent in the perpendicular direction 110. The quantity of pre-strain for a polymer may be based on the polymer material and the desired performance of the polymer in an application. Pre-strain suitable for use with the present invention is further described in commonly owned, copending U.S. patent application Ser. No. 09/619,848, which is incorporated by reference for all purposes.

Anisotropic prestrain may also improve the performance of a transducer to convert mechanical to electrical energy in a generator mode. In addition to increasing the dielectric breakdown strength of the polymer and allowing more charge to be placed on the polymer, high pre-strain may improve mechanical to electrical coupling in the low pre-strain direction. That is, more of the mechanical input into the low pre-strain direction can be converted to electrical output, thus raising the efficiency of the generator.

The quantity of pre-strain for a polymer may be based on the electroactive polymer and the desired performance of the polymer in an actuator or application. For some polymers of the present invention, pre-strain in one or more directions may range from −100 percent to 600 percent. By way of example, for a VHB acrylic elastomer having isotropic pre-strain, pre-strains of at least about 100 percent, and preferably between about 200–400 percent, may be used in each direction. In one embodiment, the polymer is pre-strained by a factor in the range of about 1.5 times to 50 times the original area. For an anisotropic acrylic pre-strained to enhance actuation in a compliant direction, pre-strains between about 400–500 percent may be used in the stiffened direction and pre-strains between about 20–200 percent may be used in the compliant direction. In some cases, pre-strain may be added in one direction such that a negative pre-strain occurs in another direction, e.g. 600 percent in one direction coupled with −100 percent in an orthogonal direction. In these cases, the net change in area due to the pre-strain is typically positive.

Pre-strain may affect other properties of the polymer 102. Large pre-strains may change the elastic properties of the polymer and bring it into a stiffer regime with lower viscoelastic losses. For some polymers, pre-strain increases the electrical breakdown strength of the polymer 102, which allows for higher electric fields to be used within the polymer—permitting higher actuation pressures and higher deflections.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. In one embodiment, the maximum area strain is at least about 5%. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least about 100 percent are possible for pre-strained polymers of the present invention. For some pre-strained polymers, maximum area strains in the range of 70 to 330 percent are common. In one embodiment, the maximum elastic area strain is at least about 10%.

Generally, after the polymer is pre-strained, it may be fixed to one or more objects. Each object may be suitably stiff to maintain the level of pre-strain desired in the polymer. The polymer may be fixed to the one or more objects according to any conventional method known in the art such as a chemical adhesive, an adhesive layer or material, mechanical attachment, etc.

Transducers and pre-strained polymers of the present invention are not limited to any particular geometry or linear deflection. For example, the polymer and electrodes may be formed into any geometry or shape including tubes and rolls, stretched polymers attached between multiple rigid structures, stretched polymers attached across a frame of any geometry—including curved or complex geometry's, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated. In another embodiment, a transducer that deflects out of the plane is referred to as a diaphragm.

Generally, after the polymer is pre-strained, it may be fixed to one or more objects. Each object is preferably suitably stiff to maintain the level of pre-strain desired in the polymer. The polymer may be fixed to the one or more objects according to any conventional method known in the art such as a chemical adhesive, an adhesive layer or material, mechanical attachment, etc. Transducers and pre-strained polymers of the present invention are not limited to any particular geometry or type of deflection. For example, the polymer and electrodes may be formed into any geometry or shape including tubes and rolls, stretched polymers attached between multiple rigid structures, stretched polymers attached across a frame of any geometry—including curved or complex geometry's, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated.

Generally, polymers that are suitable for use with transducers of this invention include any substantially insulating polymer or rubber (or combination thereof) that deforms in response to an electrostatic force or whose deformation results in a change in electric field. Preferably, the polymer's deformation is reversible over a wide range of strains. Many elastomeric polymers may serve this purpose. In designing or choosing an appropriate polymer, one should consider the optimal material, physical, and chemical properties. Such properties can be tailored by judicious selection of monomer (including any side chains), additives, degree of cross-linking, crystallinity, molecular weight, etc.

The transducer polymers of this invention may assume many different physical and chemical states. For example, they may be used with or without additives such as plasticizers. And they may be monolithic polymeric sheets or combinations of polymers such as laminates or patchworks. Further, the polymers may exist in a single phase or multiple phases. One example of a multiphase material is a polymeric matrix having inorganic filler particles admixed therewith.

Regardless of the ultimate chemical and physical state of the transducer polymer, it will include a polymer matrix. That matrix be a homopolymer or copolymer, cross-linked or uncross-linked, linear or branched, etc. Exemplary classes of polymer suitable for use with transducers of this invention include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Obviously, combinations of some of these materials may be used as the polymer matrix in transducers of this invention. Copolymers and blends fall within the class of suitable polymers. One example is a blend of a silicone elastomer and an acrylic elastomer.

Obviously, the properties of the polymer are dictated in large measure by the monomers used to produce the polymer. Each polymer type (e.g., acrylic, stryrene, silicone, urethane, etc.) has its own class of well-known monomers. In some embodiments, polymers suitable for use with the present invention may be made from monoethylenically unsaturated monomers (or combination of monomers) homopolymerizable to form a polymer. Preferred monoethylenically unsaturated monomers include isooctyl acrylate, acrylonitrile, 2-ethylhexyl acrylate, decyl acrylate, dodecyl acrylate, hexyl acrylate, isononyl acrylate, isooctyl methacrylate, and 2-ethylhexyl methacrylate. Any of these monomers may be halogenated with one or more halogens such as fluorine.)

Various classes of catalysts that may be employed for polymer fabrication depending upon the desired state of the resulting polymer. Examples include selective early transition metal single site catalysts and late transition metal catalysts that are non-selective with respect to polymer structure.

The range of possible polymers greatly increases when copolymers are considered. One widely used copolymer that is suitable for some embodiments of this invention is the thermoplastic elastomer styrene butadiene styrene (SBS) block copolymer. Another suitable copolymer includes both silicone and acrylic elastomer moieties. Yet another may include acrylic moieties, silicone moieties, and styrene/butadiene moieties. One specific preferred copolymer block contains acrylic acid and isooctyl acrylate. Another specific copolymer comprises acrylonitrile, acrylic acid, and isooctyl acrylate. Still another comprises these three acrylic components in one chain cross-linked to a separate silicone chain. Many other possibilities exist.

The molar ratio of the copolymer component moieties can be adjusted to obtain desirable results. In a preferred copolymer of isooctyl acrylate and acrylic acid, a predominance of the isooctyl acrylate is generally preferred. In one specific embodiment, the molar ratio is roughly 85/15 isooctyl acrylate to acrylic acid.

Crosslinking can sometimes be used to great advantage. Specifically, by controlling the nature of the cross-links (physical versus chemical) and their density, one can obtain desired elastic and thermal properties. Chemical cross-links are manifest by as covalent bonds. These may be produced by hydrogen abstraction or use of polyfunctional monomers, for example. Physical cross-links are obtained by aggregations of rigid groups such phenyl moieties in styrene.

The appropriate choice of a polymer side chain can provide tailored physical and material properties. In specific examples, side groups of a polymer backbone are modified to enable greater charge accumulation in bulk. This can be accomplished by modifying the side groups with lithium ions and/or transition metal organic ligand complexes, for example. Alternatively or in addition, side groups can be added to increase the polymer's dielectric constant. In one example, cyano groups serve this purpose. Such groups may be provided in the form of various phenyl nitrile groups for example. In another embodiment, conjugated oligomers in side chains or chain segments are added to increase polarizability and dielectric strength.

In many cases, materials used in accordance with the present invention are commercially available polymers. Such polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may also simplify fabrication. In a specific embodiment, the commercially available polymer is a commercially available acrylic elastomer comprising a mixture of aliphatic acrylates that are photocured during fabrication.

One suitable commercially available polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Electroactive polymers of the present invention may also include one or more additives to improve their various physical and chemical properties. Examples of suitable classes of materials include plasticizers, antioxidants, and high dielectric constant particulates. Examples of properties that can be controlled/modified by additives include adhesion and the ability of the polymer to convert between mechanical energy and electrical energy. Polymer material properties and parameters related to the ability of the polymer to convert between mechanical energy and electrical energy include, for example, the dielectric breakdown strength, maximum strain, dielectric constant, elastic modulus, properties associated with the visco-elastic performance, properties associated with creep, response time and actuation voltage.

Improving the dielectric breakdown strength allows the use of larger electrically actuated strains for the polymer. By way of example, a plasticizing additive may be added to a polymer to increase the dielectric breakdown strength of the polymer. Alternatively, certain synthetic resins may be added for this purpose. For example, a styrene-butadiene-styrene block copolymer may be added to improve the dielectric breakdown strength of certain polymers. In one example, pentalyn-H as produced by Hercules, Inc. of Wilmington, Del. was added to Kraton D2104 as produced by Shell Chemical of Houston, Tex. to improve the dielectric breakdown strength of the Kraton D2104. In this specific example, the ratio of pentalyn-H added may range from about 0 to 2:1 by weight. In another approach, dielectric breakdown strength may be increased by adding electron trapping groups such as SF6 to increase breakdown electric field.

Additives that increase the dielectric constant of a polymer include, for example, high dielectric constant particulates such as fine ceramic powders (e.g., barium titanate, strontium titanate, and titanium dioxide). Alternatively, polymers such as polyurethane may be partially fluorinated to increase the dielectric constant. Still further, layers of highly polarizable or high modulus materials such as conjugated polymers, graphite, carbon fibers, and carbon nanotubes may be added for this purpose.

An additive may be included in a polymer for the purpose of reducing elastic modulus. Reducing the elastic modulus enables larger strains for the polymer. In a specific embodiment, mineral oil is added to a solution of Kraton D to reduce the elastic modulus of the polymer. In this case, the ratio of mineral oil added may range from about 0 to 2:1 by weight, for example. Specific materials included to reduce the elastic modulus of an acrylic polymer of the present invention include any acrylic acids, acrylic adhesives, acrylics including flexible side groups such as isooctyl groups and 2-ethylhexyl groups, or any copolymer of acrylic acid and isooctyl acrylate.

As mentioned, plasticizers are often added to polymers. In the context of this invention, the addition of a plasticizer may, for example, improve the functioning of a transducer of this invention by reducing the elastic modulus of the polymer and/or increasing the dielectric breakdown strength of the polymer. Examples of suitable plasticizers include high molecular-weight hydrocarbon oils, high molecular-weight hydrocarbon greases, Pentalyne H, Piccovar® AP Hydrocarbon Resins, Admex 760, Plastolein 9720, silicone oils, silicone greases, Floral 105, silicone elastomers, nonionic surfactants, and the like. Of course, combinations of these materials may be used.

Finally, multiple additives may be included in a polymer to improve one or more materials properties. In one embodiment, it was found that addition of both mineral oil and pentalyn-H to a solution of Kraton D2104 to increase the dielectric breakdown strength and to reduce the elastic modulus of the polymer. Note that pentalyn-H may also improve the adhesion of Kraton D2104.

A second additive can also be added to overcome a problem introduced by a first additive. For example, for a commercially available silicone rubber whose stiffness has been increased by fine carbon particles added to increase the dielectric constant, the stiffness may be reduced by the addition of a carbon or silver filled silicone grease. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to 200 percent.

An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

Suitable actuation voltages for electroactive polymers, or portions thereof, may vary based on the material properties of the electroactive polymer, such as the dielectric constant, as well as the dimensions of the polymer, such as the thickness of the polymer film For example, actuation electric fields used to actuate polymer 102 in FIG. 4A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example. In some embodiments, the modulus of elasticity for the polymer may be less than about 100 MPa.

Transducers for converting between mechanical and electrical energy of the present invention also encompass multilayer laminates. In one embodiment, a multilayer laminate refers to a structure including one or more layers in addition to a single electroactive polymer and its corresponding electrodes. In one embodiment, a multilayer laminate refers to a structure having a transducer including an electroactive polymer and its corresponding electrodes, a layer laminated to at least one of the electrode and the polymer, and the layer mechanically coupled to a portion of the transducer. Multilayer laminates may be referred to as either external or internal. For external multilayer laminates, the one or more additional layers are not between the electrodes. For internal multilayer laminates, the one or more additional layers are between the electrodes. For either external or internal layers, the layers may be adhered using an adhesive or glue layer, for example.

Internal multilayer laminates may be used for a wide variety of purposes. A layer may also be included in an internal multilayer laminate to improve any mechanical or electrical property of the transducer, e.g., stiffness, electrical resistance, tear resistance, etc. Internal multilayer laminates may include a layer having a greater dielectric breakdown strength. Internal multilayer laminates may include multiple layers of compatible materials separated by conducting or semiconducting layers (e.g. metallic or polymer layers) to increase breakdown strength of the laminate transducer. Compatible materials refer to materials that comprise the same or substantially similar material or have the same or substantially similar properties (e.g. mechanical and/or electrical). Internal laminates of compatible materials relative to the polymer may be used to compensate for manufacturing defects in the polymer and provide greater transducer uniformity. By way of example, a 100 micrometer thick, single layer polymer may have a defect that may effect the entire 100 micrometer thickness. In this case, a laminate of ten layers each having a thickness of 10 micrometers may be used such that any manufacturing defects are localized to a 10 micrometer polymer—thus providing a comparable 100 micrometer thick laminate structure, but with greater uniformity and fault tolerance compared to the single layer polymer. Internal laminates of compatible materials relative to the polymer may also be used to prevent any runaway pull-in effect. Runaway pull-in effect refers to when the electrostatic forces between electrodes getting closer increases faster than the elastic resistive forces of the polymer. In such cases, the transducer may become electromechanically unstable, leading to rapid local thinning and electrical breakdown. An internal layer may also be used to afford a layer of protection (electrical or mechanical) to another layer in the composite. In one embodiment, an electrical barrier layer is mechanically coupled between an electrode and the polymer to minimize the effect of any localized breakdown in the polymer. Breakdown may be defined as the point at which the polymer cannot sustain the applied voltage. The barrier layer is typically thinner than the polymer and has a higher dielectric constant than the polymer such that the voltage drop mainly occurs across the polymer. It is often preferable that the barrier layer have a high dielectric breakdown strength.

External multilayer laminates may be used for a wide variety of purposes. In one embodiment, an external multilayer composite includes a layer to control stiffness, creep, to distribute load more uniformly during deflection, to increase tear resistance, or to prevent runaway pull effect. External laminates of compatible polymers including electrodes may be used to distribute load across each of the polymer layers or increase polymer uniformity during deflection. A layer may also be included in an external laminate having a higher stiffness than the polymer, e.g., a material having a higher stiffness or a different amount of pre-strain for a compatible material, to bias a diaphragm, pump or bending beam. In a generator mode, a stretched transducer may contract and generate electrical energy as long as the electrical field stresses are lower than the elastic restoring stresses. In this case, adding a stiffening layer may allow the transducer to contract against greater field stresses, thereby increasing its energy output per stroke. An external layer may also be used to afford a layer of protection (electrical or mechanical) to another layer in the composite. In another specific embodiment, an external composite includes a foam layer to bias a small pump or diaphragm. The foam layer may comprise an open pore foam that allows fluids to move in and out of the foam. An external layer having a low stiffness may also be used for electric shielding without introducing excessive mechanical energy loss.

In one embodiment, a composite is formed by rolling or folding a polymer to produce a transducer with high-density packaging. In order to avoid detrimental electric fields in the vicinity of folds for laminates including folded layers, electrodes may be patterned on the polymer such that any polymer in the vicinity of the folds does not have overlapping opposite electrodes. In addition, the polymer and electrodes may be rolled or folded such that the outer exposed electrode or electrodes have the same polarity. Fabrication may be performed such that electrodes of opposite polarity are separate by polymer. For example, a rolled actuator can be made by rolling up two layers of polymer with electrodes, or a single layer can be first folded, then rolled. Additionally, the outer exposed electrode may be grounded to increase safety of the transducer. An external laminate outer skin layer may also be added to further increase safety.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry. Several examples of electrodes that only cover a portion of an electroactive polymer will be described in further detail below.

Various types of electrodes suitable for use with the present invention are described in commonly owned, copending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. By way of example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Electronic drivers are typically connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

4. Multiple Active Areas

Figure 4C:
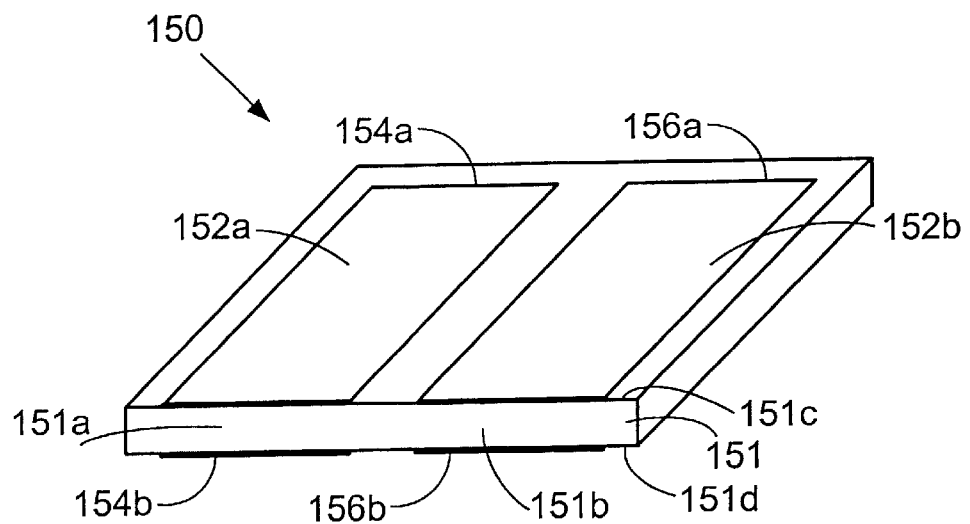
FIG. 4C illustrates a monolithic transducer comprising a plurality of active areas in accordance with one embodiment of the present invention.

In accordance with the present invention, the term "monolithic" is used herein to refer to electroactive polymers, transducers, and devices comprising a plurality of active areas. FIG. 4C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 having two active areas 152a and 152b. Polymer 151 may be held in place using, for example, a rigid frame (not shown) attached at the edges of the polymer.

The active area 152a has top and bottom electrodes 154a and 154b that are attached to polymer 151 on its top and bottom surfaces 151c and 151d, respectively. The electrodes 154a and 154b provide a voltage difference across a portion 151a of the polymer 151. The portion 151a deflects with a change in electric field provided by the electrodes 154a and 154b. The portion 151a comprises the polymer 151 between the electrodes 154a and 154b and any other portions of the polymer 151 having sufficient electrostatic force to enable deflection upon application of voltages using the electrodes 154a and 154b. When the device 150 is used as a generator to convert from electrical energy to mechanical energy, deflection of the portion 151a causes a change in electric field in the portion 151a that is received as a change in voltage difference by the electrodes 154a and 154b.

The active area 152b has top and bottom electrodes 156a and 156b that are attached to the polymer 151 on its top and bottom surfaces 151c and 151d, respectively. The electrodes 156a and 156b provide a voltage difference across a portion 151b of the polymer 151. The portion 151b deflects with a change in electric field provided by the electrodes 156a and 156b. The portion 151b comprises the polymer 151 between the electrodes 156a and 156b and any other portions of the polymer 151 having sufficient stress induced by the electrostatic force to enable deflection upon application of voltages using the electrodes 156a and 156b. When the device 150 is used as a generator to convert from electrical energy to mechanical energy, deflection of the portion 151b causes a change in electric field in the portion 151b that is received as a change in voltage difference by the electrodes 156a and 156b.

The active areas for monolithic polymers and transducers of the present invention may be flexibly arranged. In one embodiment, active areas in a polymer are arranged such that the elasticity of the active areas is balanced. In another embodiment, a transducer of the present invention comprises a plurality of symmetrically arranged active areas. While one embodiment of present invention will now be described as a device, those skilled in the art will recognize that the present invention encompasses methods having as steps the actions performed by various parts of the device described below.

Figure 4D:
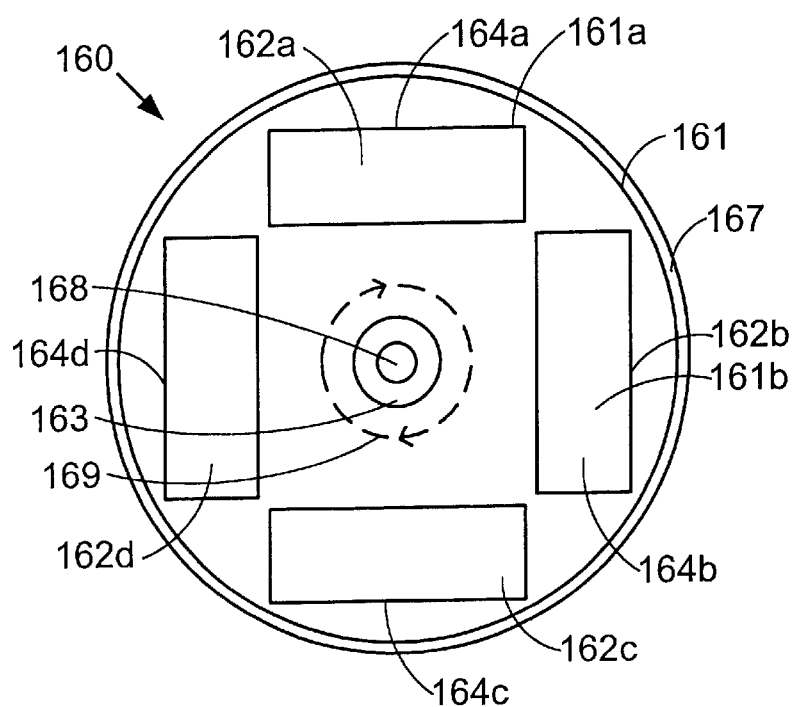
FIG. 4D illustrates a device comprising a plurality of symmetrically arranged electrodes in accordance with a specific embodiment of the present invention.

FIG. 4D illustrates a monolithic device 160 comprising a plurality of symmetrically arranged active areas in accordance with a specific embodiment of the present invention. The device 160 comprises a monolithic transducer comprising four active areas 162a–d. Each of the active areas 162a–d comprises top and bottom electrodes 164a–d attached to a polymer 161 on its top and bottom surfaces, respectively (only electrodes 164a–d on the facing surface of the polymer 161 are illustrated). The electrodes 164a–d each provide a voltage difference across a portion of the polymer 161. The electrodes 164a–d and their corresponding active areas 162a–d are symmetrically and radially arranged around a center point of the circular polymer 161. Correspondingly, the elasticity of the polymer material included in the active areas 162a–d is balanced.

A first active area 162a is formed with the two first active area electrodes 164a and a first portion of the electroactive polymer 161a. The portion 161a is arranged in a manner which causes the first portion 161a to deflect in response to a change in electric field provided by the first active area electrodes 164a. The portion 161a includes the polymer 161 between the electrodes 162a and any other portions of the polymer 161 having sufficient stresses induced by the electrostatic force to enable deflection upon application of voltages using the electrodes 162a. Similarly, a second active area 162c is formed with the two second active area electrodes 164c and a second portion of the electroactive polymer 161c. The portion 161c is arranged in a manner which causes the second portion 161c to deflect in response to a change in electric field provided by the at least two second active area electrodes 164c. A similar arrangement applies to the active areas 162b and 162d.

A substantially rigid frame 167 is fixed to the perimeter of the circular polymer 161 by using an adhesive. A substantially rigid member 168 is attached to a central portion 163 of polymer 161 and allows mechanical output for device 160. Rigid member 168 provides mechanical output for device 160 based on deflection of the central portion 163 relative to the rigid frame 167. The central portion 163 is located at least partially between active area 162a and active area 162c and at least partially between active area 162b and active area 162d. Although central portion 163 is illustrated as a centrally located circle, it should be understood that central portion 163 may be any portion of polymer 161 between the active areas 162a–d. Thus, rigid member 168 may be attached to polymer 161 in any part of polymer 161 between the active areas 162a–d and transfer deflection of that portion as mechanical output of device 160.

The present invention also includes methods for deflecting one or more electroactive polymers having a plurality of active areas. These methods comprise deflection as a result of electrical energy input (actuation) to the polymer and electrical energy output from the polymer (generation). Methods for using a monolithic transducer as an actuator generally comprise providing a change in electric field with two first active area electrodes to deflect a first portion of the monolithic transducer; and providing a change in electric field with two second active area electrodes to deflect a second portion of the monolithic transducer. Other active areas may be used in the monolithic transducer. In one embodiment, active areas on one or more electroactive polymers are sequentially actuated, either individually or cumulatively, to produce a desired deflection of a portion of the polymer. In a specific embodiment, the active areas on a monolithic polymer may be actuated sequentially to move a portion of the polymer along a path.

For example, the active areas 162a–d may be actuated sequentially to move the central portion 163 along a circular path 169. Actuation of the active area 162a moves the central portion 163 down. Actuation of the active area 162b moves the central portion 163 to the left. Actuation of the active area 162c moves the central portion 163 up. Actuation of the active area 162d moves the central portion 163 to the right. When electrical energy is removed from the electrodes 164a, the central portion 163 elastically returns up to its position before actuation of the active area 162a. A similar elastic return occurs for the other active areas 164b–d. To achieve the circular path 169, the active areas 162a–d are actuated sequentially in clockwise order and in a timely manner. More specifically, electrical energy is supplied to the electrodes 164b while the active area 162a contracts. Electrical energy is supplied to the electrodes 164c while the active area 162b contracts.

A similar timing is applied in actuating the other active areas to produce the circular path 169. This sequential clockwise actuation may be repeatedly performed to continuously move the central portion 163 in the circular path 169. Continuous circular output of the central portion 163 may be used to drive a motor. In a specific embodiment, rigid member 168 may be used as a crank in a rotary crank motor. In another specific embodiment, rigid member 168 may be a plate with bearings to allow the plate to move in both planar directions of the plate. The monolithic device 160 then functions as an x-y (two degree-of-freedom) translation table.

The monolithic transducers 150 and 160 illustrated and described herein comprise active areas with similar geometry's and symmetrical configurations. It is understood that monolithic polymers of the present invention may comprise one or more active areas each having a non-symmetrical and custom geometry. It is also understood that active areas on a monolithic polymer may be combined in any configuration. These custom geometry active areas and configurations may be used to produce any custom two-dimensional path or output for a portion of a polymer. In another embodiment, the two-dimensional path illustrated above may be achieved with only two active areas without the use of expanding and relaxing pairs as described above. In this case, actuation of one active area and its corresponding elastic return may be used to provide controlled deflection along one linear dimension. Actuation of the other active area and its corresponding elastic return may be used to provide controlled deflection in an orthogonal linear dimension.

Monolithic transducers and devices are not limited to planar deflections. In a specific embodiment, monolithic transducers may be used to deflect and control out-of-plane motion. For example, actuating all four active areas 162a–d at the same time typically will not change the planar position of the centrally attached rigid member 168, but it will reduce the forces from polymer 161 which tend to hold rigid member 168 in the plane of the film. Thus, if rigid member 168 is suitably loaded by an out-of-plane force, such as a spring or gravity, actuating all four active areas 162a–d at once will cause rigid member 168 to move further out of the plane in the direction of the out-of-plane force. By controlling the amount of energizing (e.g. controlling the voltage) on each of the active areas 162a–d, one can thus control the position of a suitably loaded rigid member 168 in three translational degrees-of-freedom.

5. Actuator and Generator Devices

The deflection of an electroactive polymer can be used in a variety of ways to produce or receive mechanical energy. Generally, monolithic electroactive polymers of the present invention may be implemented in a variety of actuators and generators—including conventional actuators and generators retrofitted with a monolithic polymer and custom actuators and generators specially designed for one or more monolithic polymers. Conventional actuators and generators include extenders, bending beams, stacks, diaphragms, etc. Several exemplary actuators and generators suitable for use with the present invention will now be discussed. Additional actuators suitable for use with various embodiments of the present invention are described in copending U.S. patent application Ser. No. 09/619,848, which was incorporated by reference above.

Figure 5A:
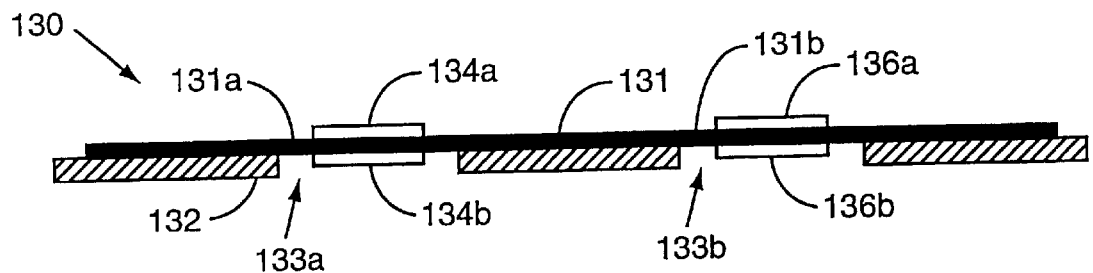
FIGS. 5A and 5B illustrate a device comprising a monolithic transducer for converting between electrical energy and mechanical energy in accordance with another embodiment of the present invention.

FIG. 5A illustrates a cross-sectional side view of a monolithic diaphragm device 130 comprising a monolithic polymer 131 before deflection in accordance with one embodiment of the present invention. The polymer 131 is attached to a frame 132. The frame 132 includes apertures 133a and 133b that allow deflection of polymer portions 131a and 131b perpendicular to the area of the apertures 133a and 133b, respectively. The diaphragm device 130 comprises electrodes 134a and 134b attached on either side of the portion 131a to provide a voltage difference across the portion 131a. Electrodes 136a and 136b are deposited on either side of the portion 131b to provide a voltage difference across the portion 131b. Electrodes 134a–b and 136a–b can be routed to different portions of the polymer 131 for connection to external electronics. In some embodiments the external electronics can be connected directly to the electrodes 134a–b and 136a–b. In other embodiments, various other connection methods can be used. In one preferred embodiment, for example, the electrodes are routed to separate areas on frame 132 away from apertures 133a–b. A second frame, not shown in FIG. 5, is then screwed into frame 132 through screw holes, not shown in FIG. 5, in frame 132. The screws puncture the polymer 131 and one or more of the electrodes 134a–b and 136a–b (depending on the desired connection configuration), and in the puncturing process make electrical connections to the electrodes 134a–b and 136a–b. The screws can then be used for external electrical connections. In one preferred embodiment, a thin piece of brass (or a conductive polymer tape) is included in the connection area lying flat on the polymer 131 with a hole slightly smaller than the screws. In this case, the screw makes connection with the brass and the brass touches the appropriate electrode. The electrodes 134 and 136 are compliant and change shape with polymer 131 as it deflects. In the voltage-off configuration of FIG. 5A, polymer 131 is stretched and secured to frame 132 with tension to achieve pre-strain.

Figure 5B:
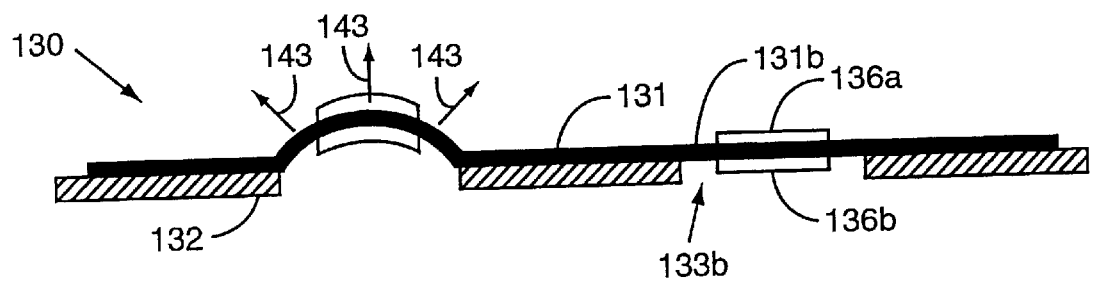

Using electrodes 134 and 136, portions 131a and 131b are capable of independent deflection. For example, upon application of a suitable voltage between electrodes 134a and 134b, portion 131a expands away from the plane of the frame 132, as illustrated in FIG. 5B. Each of the portions 131a and 131b is capable of expansion in both perpendicular directions away from the plane. In one embodiment, one side of polymer 131 comprises a bias pressure that influences the expansion of the polymer film 131 to continually actuate upward in the direction of arrows 143 (FIG. 5B). In another embodiment, a swelling agent such as a small amount of silicone oil is applied to the bottom side to influence the expansion of polymer 131 in the direction of arrows 143. The swelling agent allows the diaphragm to continually actuate in a desired direction without using a bias pressure. The swelling agent causes slight permanent deflection in one direction as determined during fabrication, e.g. by supplying a slight pressure to the bottom side when the swelling agent is applied.

The diaphragm device 130 may be used as a generator. In this case, a pressure, such as a fluid pressure, acts as mechanical input to the diaphragm device 130 on one side to stretch polymer 131 in the vicinity of apertures 133a and 133b. After the stretch, a voltage difference is applied between electrodes 134 while portions 131a is stretched. The resulting change in electric field provided to electrodes 134 is less than the electric field needed to further deflect polymer 131a. Similarly, a voltage difference is applied between electrodes 136 while portion 131b is stretched. Releasing the pressure allows portions 131a and 131b to contract and increase the stored electrical energy on electrodes 134 and 136.

Although the monolithic diaphragm device 130 is illustrated and described with only two apertures that allow deflection of polymer portions perpendicular to the area of the apertures, it is understood the monolithic diaphragm device 130 may include a large number of apertures in any two dimensional array. Generally, an array for a monolithic polymer refers to a plurality of active areas on a single polymer arranged in any manner, number of configuration. For example, the diaphragm device 130 may include an array of 36 active areas arranged in a 6×6 grid. Alternatively, the array on a monolithic polymer may include a combination of custom geometry active areas. These separate active areas may or may not interact mechanically or electrically with each other. In one embodiment, at least two active areas in the array are capable of independent electrical communication and control.

Figure 5D:
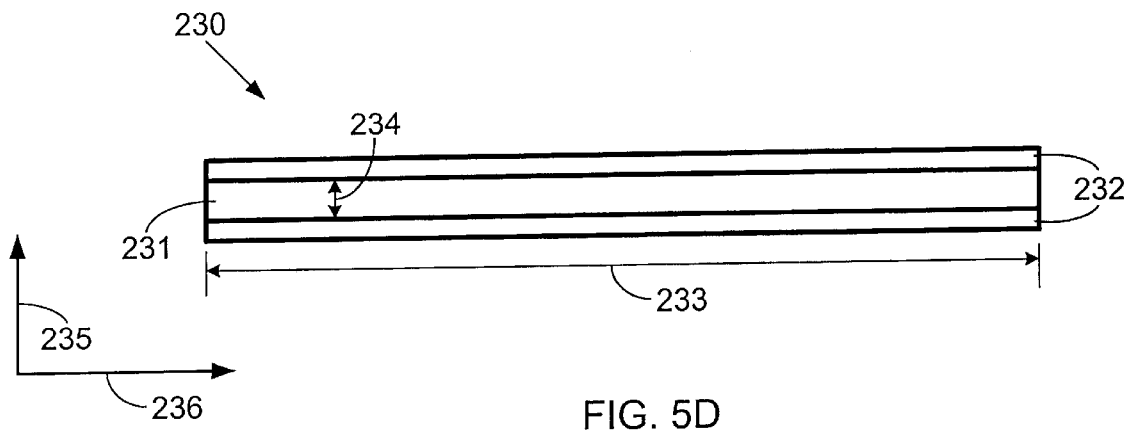
FIGS. 5D and 5E illustrate a device for converting between electrical energy and mechanical energy before and after actuation in accordance with a specific embodiment of the present invention.
Figure 5E:
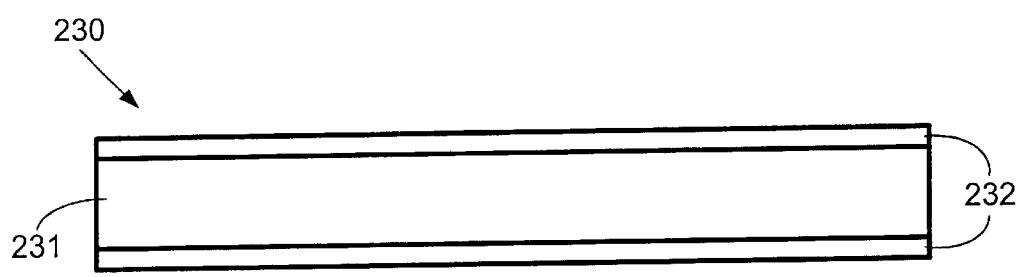

FIGS. 5D and 5E illustrate a linear motion device 230 for converting between electrical energy and mechanical energy before and after actuation in accordance with a specific embodiment of the present invention. The linear motion device 230 is a planar mechanism having mechanical translation in one direction. The linear motion device 230 comprises a polymer 231 having a length 233 substantially greater than its width 234 (e.g., an aspect ratio at least about 4:1). The polymer 231 is attached on opposite sides to stiff members 232 of a frame along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in a direction 235. When the linear motion device 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result. By way of example, such an arrangement may produce linear strains of at least about 200 percent for acrylics having an anisotropic pre-strain.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion devices 230 may be combined in series in the direction 235 to form an actuator having a cumulative deflection of all the linear motion devices in the series. When transducing electric energy into mechanical energy, electroactive polymers—either individually or mechanically linked in a collection—may be referred to as 'artificial muscle'. For purposes herein, artificial muscle is defined as one or more transducers and/or actuators having a single output force and/or displacement. Artificial muscle may be implemented on a micro or macro level and may comprise any one or more of the actuators described herein.

Figure 5F:
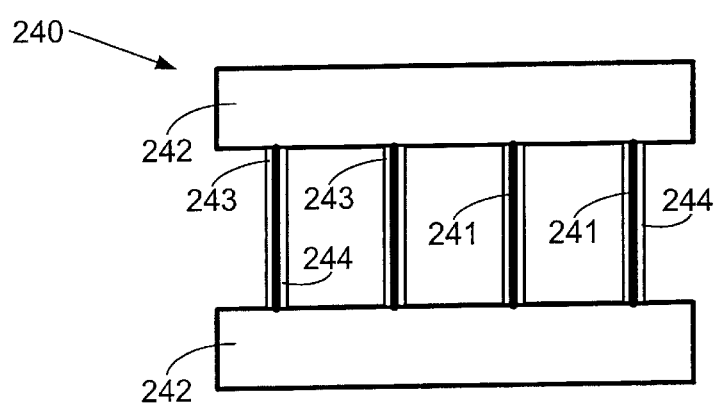
FIG. 5F illustrates a cross-sectional side view of a transducer including multiple polymer layers in accordance with one embodiment of the present invention.

FIG. 5F illustrates cross-sectional side view of a multilayer device 240 for converting between electrical energy and mechanical energy as an example of artificial muscle in accordance with a specific embodiment of the present invention. The multilayer device 240 includes four pre-strained polymers 241 arranged in parallel and each attached to a rigid frame 242 such that they have the same deflection. Electrodes 243 and 244 are deposited on opposite surfaces of each polymer 241 and provide simultaneous electrostatic actuation to the four pre-strained polymers 241. The multilayer device 240 provides cumulative force output of the individual polymer layers 241.

Combining individual polymer layers in parallel or in series has a similar effect on transducers operated in a generator mode. In general, coupling layers in parallel increases the stiffness and maximum input force of the device without changing its maximum stroke, while combining layers in series increases the maximum stroke without increasing the maximum input force. Thus, by combining layers in series and parallel, a generator can be designed to match a specific input mechanical load.

Figure 5G:
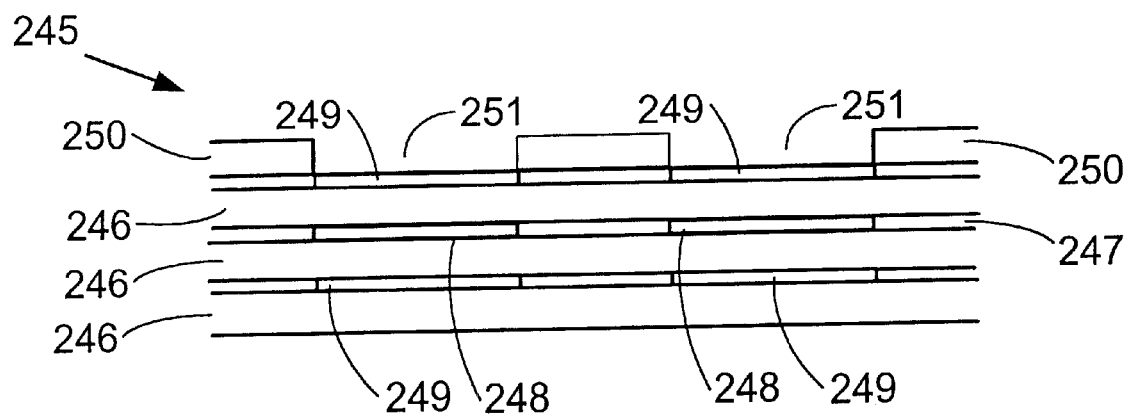
FIG. 5G illustrates a stacked multilayer device as an example of artificial muscle in accordance with one embodiment of the present invention.

In another embodiment, multiple electroactive polymer layers may be used in place of one polymer to increase the force or pressure output of an actuator, or to increase the electrical energy generated from a generator. For example, ten electroactive polymers may be layered to increase the pressure output of the diaphragm device of FIG. 5A. FIG. 5G illustrates such a stacked multilayer diaphragm device 245 for converting between electrical energy and mechanical energy as another example of artificial muscle in accordance with one embodiment of the present invention. The stacked multilayer device 245 includes three polymer layers 246 layered upon each other and may be attached by adhesive layers 247.

In one preferred embodiment, thin mylar or acetate pieces are inserted between the polymer layers in the attached area to prevent visco-elastic flow of the polymer stack. The thin mylar or acetate support pieces, typically 10 to 100 microns thick, act as interleaved support structures and are particularly useful when the film has a high prestrain to distribute the prestrain load. Otherwise the multilayers with high prestrain may cause bowing and pulling loose at the edge of the film. The interleaved support structures can be added for every layer of polymer 246, or they can be added every 2–5 layers depending on the amount of prestrain, film modulus, film thickness, and specific geometry. The interleaved support structures are typically bonded or stuck to the inactive outer edges of the polymer layers 246. Within the adhesive layers 247 are electrodes 248 and 249 that provide electromechanical coupling to polymer layers 246. A relatively rigid plate 250 is attached to the outermost polymer layer and patterned to include holes 251 that allow deflection for the stacked multilayer diaphragm device 245. By combining the polymer layers 246, the stacked multilayer device 245 provides cumulative force output of the individual polymer layers 246 in the case of an actuator, or the cumulative electrical output of the individual polymer layers 246 in the case of a generator.

Devices in accordance with another embodiment of the present invention may use multiple directions of deflection of an electroactive polymer to produce deflection in the output direction. FIGS. 5H–5K illustrate top and side perspective views of a three-dimensional device 370 for converting between electrical energy and mechanical energy in accordance with one embodiment of the present invention. The device 370 uses multiple planar directions of deflection of an electroactive polymer to produce deflection in a non-planar output direction.

As illustrated in FIGS. 5H and 5I, the device 370 comprises a transducer and a frame 374. The transducer includes a polymer 373. The polymer 373 is in electrical communication with electrodes 375 in a manner that supports one of electrical generation and mechanical actuation. Electrodes 375a and 375b are attached to opposite surfaces of the polymer 373. The electrodes 375a and 375b provide or receive electrical electric energy to or from the polymer 373. Planar directions 372a and 372b are defined in a plane 372 corresponding to the largest polymer 373 surface. A direction 376 is not coplanar with plane 372 and is substantially orthogonal to the plane 372. The device 370 allows deflection of polymer 373 in planar directions 372a and 372b to produce displacement in the not coplanar direction 376.

The frame 374 comprises a base 380 and four rigid members 382a–d. More than four rigid members 382a–d can be used if desired. Larger numbers of symmetrically-configured rigid members 382a–d than the four shown provide a more uniform strain to polymer 373 but add additional complexity and mass. Preferred embodiments generally use 4–8 rigid members 382a–d. The members 382a–d translate between planar deflection of the polymer 373 and deflection in the not coplanar direction 376. Each of the four members 382a–d is hingeably or pivotally coupled at its proximate end 383a–d to a different corner portion of the polymer 373. Each rigid member 382a–d also includes a distal end 384 hingeably or pivotally coupled to the base 380. The base 380 limits motion for any one of the members 382a–d to rotation about the base 380. In addition, the polymer 373 restricts motion for any one of the members 382a–d according to the geometry and elasticity of the polymer 373. In a specific embodiment, coupling between each member 382 and the polymer 373 comprises a thin piece of flexible acetate (or other thin flexible material) attached to both the member 382 and the polymer 373. In another specific embodiment, coupling between each member 382 and base 380 comprises a thin piece of flexible acetate attached to both the member 382 and base 380. In yet another embodiment, the base 380 may not be used and the members 382a–d may be connected at their distal ends 384a–d by a common acetate joint. Collectively, interconnection between the polymer 373 and the members 382a–d provides a synchronous mechanical response for the device 370. As a result of this synchronous response, planar deflection of the polymer 373, or portion thereof, translates into non-planar deflection of the device 370 in the not coplanar direction 376.

Upon actuation of the polymer 373, the polymer 373 expands and the proximate ends 383a–d of two adjacent members 382a–d separate in one of the planar directions 372a and 372b. For example, upon actuation of the polymer 373, planar expansion of the polymer 373 causes proximate ends 383a and 383b of the members 382a and 382b, respectively, to separate in planar direction 372a, as illustrated in FIG. 5J. Similarly, planar expansion of the polymer 373 causes proximate ends 383b and 383c of the members 382b and 382c, respectively, to separate in planar direction 372b. Due to deflection restrictions provided by the base 380, the polymer 373, and interconnectivity between the members 382a–d, separation of the proximate ends 383a–d of the members 382a–d translates into a reduced vertical height 385 as the distance between the base 380 and the polymer 373 decreases, as illustrated in FIG. 5K. Thus, deflection of the polymer 373 in the plane 372 causes the proximate ends 383a–d of the members 382a–d to translate along the plane 372 and causes the distal ends 384a–d of the members 382a–d to translate together in the not coplanar direction 376.

Each rigid member 382 may also act as a lever arm to increase mechanical advantage for the device 370. The lever arm provided by each member 382a–d improves translation of planar deflection of the polymer 373 into the not coplanar direction 376, and vice versa. More specifically, deflection in the not coplanar direction 376 forces the members 382a–d to expand outward and downward toward the polymer 373 (FIGS. 5J and 5K). In this manner, a small downward deflection in the not coplanar direction 376 becomes a large expansion in the plane of the polymer 373 when the rigid members 382a–d start from an orientation substantially, but not completely, in the not coplanar direction 376. This leverage is advantageous when the device 370 is used as a generator and external mechanical work is provided in the direction 376. As a result of the leverage provided by the members 382a–d, the device 370 is able to provide a relatively large electrical energy change for a small deflection in the not coplanar direction 376.

The members 382a–d are arranged frustroconically about the base 380. Symmetry of the members 382a–d provides a uniform stretch distribution for the polymer 373. Uniform stretch distribution for the polymer 373 may improve performance of the device 370 when used as a generator since electrical energy resulting from external mechanical input may be harvested from a relatively larger planar area of the polymer 373 and not just a small portion. Although the device 370 is illustrated with four members 382a–d, a different number of members 382a–d may be used. In a specific embodiment, the four members 382a–d are replaced by two substantially wide members that translate planar deflection of the polymer 373 into the not coplanar direction 376. Typically, as the number of members 382a–d increases, stretch uniformity for the polymer 373 increases, which may lead to a greater uniform stretch distribution for the polymer 373, and thus improved performance in most cases.

The base 380 may also be used for external mechanical attachment. For example, mechanical output may be attached to the base 380 that receives polymer 373 deflection when the device 370 is being used as an actuator. Similarly, mechanical input may be attached to the base 380 to provide input mechanical energy to the polymer 373 when the device 370 is being used as a generator.

In one embodiment, the frame 374 is configured at its resting position such that the members 382a–d pre-load the polymer 373. The pre-load can, for example, be incorporated by coupling the polymer 373 to each of the rigid members 382a–d using a spring-like flexible material initially attached so as to exert planar pre-load forces on polymer 373. The pre-load results in a pre-strain for the polymer 373. In other words, the frame 374 is configured such that the polymer 373 is elastically deformed in tension while the device 370 is at resting position. The polymer 373 tension tends to pull the members 382a–d to contract towards each other. As mentioned above, pre-strain of an electroactive polymer may be used to enhance performance of an electroactive polymer as a transducer. Pre-straining the polymer 373 may allow the device 370 to use lower actuation voltages for the pre-strained polymer 373 to provide a given deflection. As the device 370 has a lower effective modulus of elasticity in the plane, the mechanical constraint provided by the frame 374 allows the device 370 to be actuated in the plane to a larger deflection with a lower voltage. In addition, the high pre-strain in the plane increases the breakdown strength of the polymer 373, permitting higher voltages and higher deflections for the device 370.

The device 370 may be adapted or designed to a specific application. For example, multiple polymer layers, and accompanying electrodes, may be stacked in parallel to further increase force output or electrical recovery of the device 370.

In another embodiment, more than four members 382 is coupled to the perimeter of the polymer 373. A flexible material may also be attached between each of the members 382. When the flexible material is continuous over the base 380 and there are a large number of members 382, the resulting structure may appear similar to a cupcake liner. When the flexible material is attached to the polymer 373 in a sealing manner, this structure may also be used to enclose a fluid. The combination of the flexible material and the polymer may form a chamber which encloses the fluid. External mechanical input that changes the pressure within the enclosure then causes the polymer 373 to deflect. This deflection may be used to produce electrical energy according to generator techniques described above.

The device 370 is modular. FIG. 5L illustrates a side perspective view of a device 390 in accordance with one embodiment of the present invention. The device 290 comprises the device 370 of FIGS. 5H–5K as well as a frame 391 attached to the opposite side of the polymer 373. The frames 374 and 391 are combined in an opposing arrangement to form the device 390.

The frame 391 comprises a base 393 and four opposing rigid members 392a–d. The opposing members 392a–d translate between planar deflection of the polymer 373 and deflection in the not coplanar direction 394. Each of the four opposing members 392 is coupled at its proximate end 395 to a different corner portion of the polymer 373—on the opposite surface of the polymer 373 than the members 382a–d. Each opposing rigid member 392 also includes a distal end 396a–d coupled to the base 393. Interconnection between the polymer 373 and the opposing members 392 provides a synchronous mechanical response for the device 390 similar to that described above with respect to the members 382a–d. As a result of this synchronous response, planar deflection of the polymer 373, or portion thereof, causes the proximate ends 395a–d of the members 392a–d to translate along the plane 372 and causes the distal ends 396a–d of the members 392a–d to translate together in the not coplanar direction 394.

Deflection of any of portion of the polymer 373 causes the distance between bases 380 and 393 to change. More specifically, interconnection between polymer 373 and the members 382, coupled with interconnection between polymer 373 and the members 392, provides a synchronous mechanical response for the device 390. As a result, planar deflection of any portion of the polymer 373 translates into deflection of the device 390 that includes vertical deflection between the bases 380 and 393. For example, deflection of the polymer 373 in response to a change in electric field provided by the electrodes 375 decreases the distance between the bases 380 and 393.

The spider device 390 also works well as a generator to convert mechanical energy to electrical energy. In one embodiment, external mechanical energy is used to decrease the distance between bases 380 and 393. A decrease in distance between the bases 380 and 393 causes planar expansion for the polymer 373. The external mechanical energy, or a portion thereof, is then stored as elastic energy in the polymer 373. At some point before or during the external mechanical deflection, a relatively small voltage difference is applied between electrodes 375. The relatively small voltage difference is provided such that the resulting electrostatic forces are insufficient to balance the elastic restoring forces of the final stretch provided by the external mechanical energy. Upon removal of the external mechanical energy, the device 390 elastically contracts to, or near, its resting position—thus increasing the distance between bases 380 and 393 and increasing the electrical energy of the transducer as the polymer 373 contracts. A portion of the polymer 373 in electrical communication with electrodes 375 may be used to generate electrical energy from the polymer 373 contraction.

In another embodiment using a pre-load to pre-strain the polymer in the resting position, external mechanical energy is used to cause the distance between bases 380 and 393 to increase. In this case, electrical energy is harvested from the device 390 as the distance between bases 380 and 393 increases. Elastic return of the polymer due to the pre-load may then be used to return the device 390 to its resting position.

Some or all of the charge and energy can be removed from the electrodes 375 when the polymer 373 is fully contracted. Alternatively, some or all of the charge and energy can be removed during contraction. If the electric field pressure in the polymer 373 increases and reaches a balance with the elastic restoring forces during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. When electrical energy is removed from the polymers 397 and 398 as they contract, the device 390 continues to elastically return back to its resting position before the external mechanical energy was applied.

Mechanical coupling of the device 390 improves mechanical energy to electrical energy conversion. More specifically, lever arms provided by the members 382 and members 392 increase planar expansion of the polymer 373 for a given change in height between the bases 380 and 393 when the lever arms provided by the members 382 and 392 are relatively long (in the rest position the lever arms may be substantially, but not quite, in line with the not coplanar direction 394). Thus, even for a relatively short deflection between the bases 380 and 393, the device 390 bows outward substantially. In this manner, a small contraction between the bases 380 and 393 becomes a relatively large expansion for the polymer 373. The device 390 is then suitable for applications as a generator where a low stroke mechanical input is provided. Alternately, the lever arms provided by the members 382 and 392 may be made relatively shorter so that in the rest position they are substantially, but not quite, perpendicular to the not coplanar direction 394. In this case, a relatively large deflection between the bases 380 and 393 causes a small expansion for the polymer 373. The device 390 then becomes suitable for a generator where relatively larger deflections are provided compared to the desired polymer deflection. Thus, by designing the lever arms provided by members 382 and 392 the device 390 may be designed for various force-stroke inputs depending on the application and desired polymer.

Figure 5N:
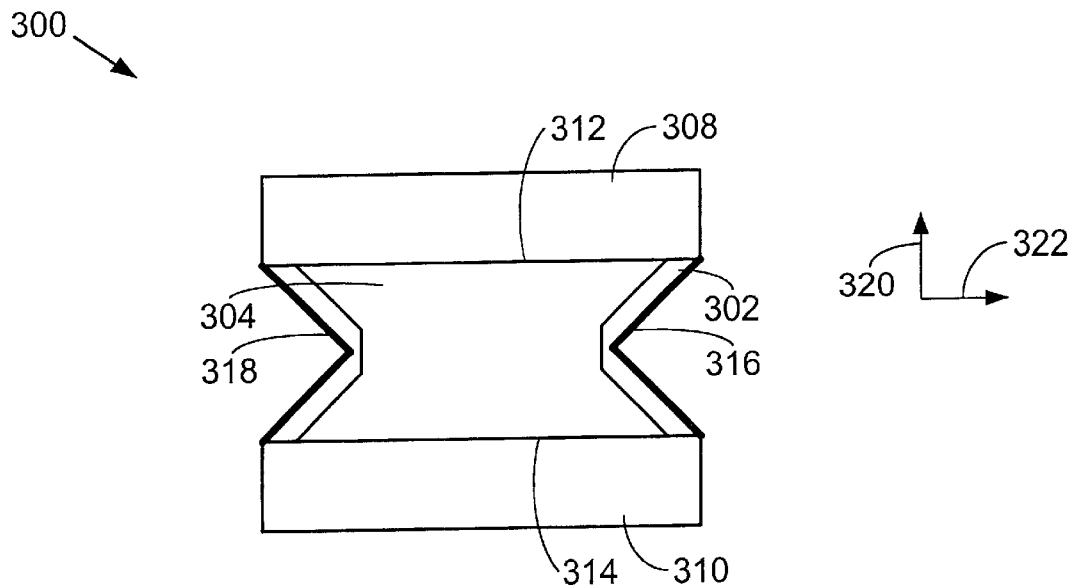
FIGS. 5N and 5O illustrate a device for converting between electrical energy and mechanical energy in accordance with another embodiment of the present invention.
Figure 5O:
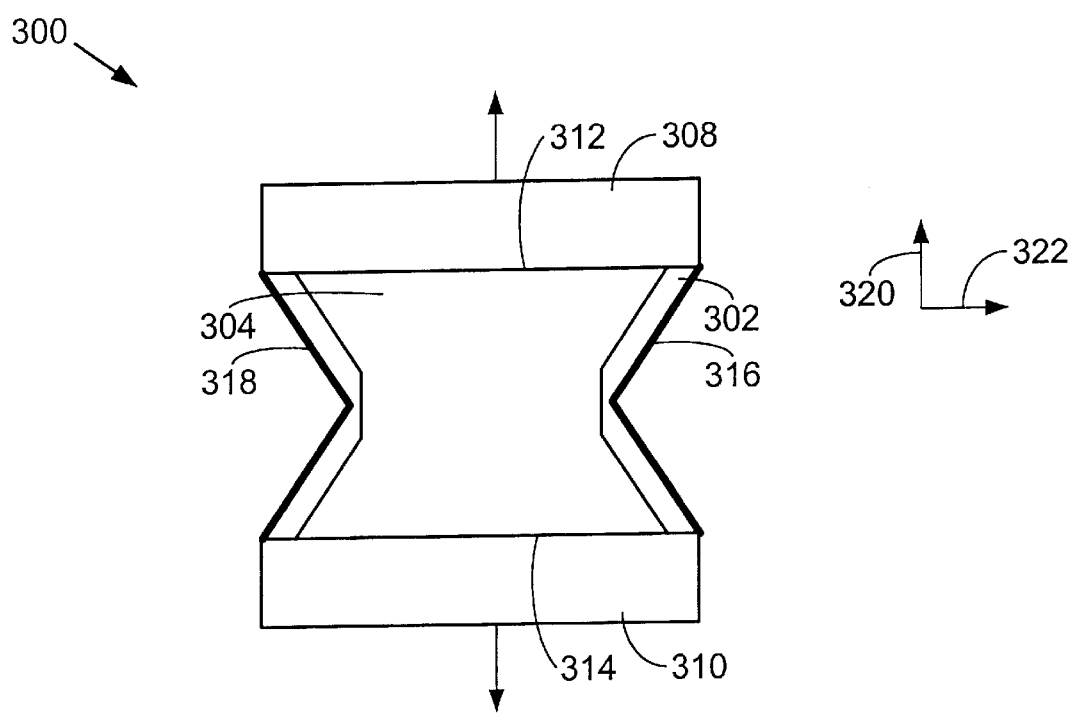

FIGS. 5N and 5O illustrate a device 300 for converting between electrical energy and mechanical energy in accordance with another embodiment of the present invention. The device 300 includes a polymer 302 arranged in a manner which causes a portion of the polymer to deflect in response to a change in electric field and/or arranged in a manner which causes a change in electric field in response to deflection of the polymer. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion between electrical energy and mechanical energy for the device 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 5O. In addition, expansion of the polymer 302 in the direction 322 causes the flexures 316 and 318 to straighten, and further separates the stiff members 308 and 310. In this manner, the device 300 couples expansion of the polymer 302 in both planar directions 320 and 322 into mechanical output in the direction 320.

In one embodiment, the polymer 302 is configured with different levels of pre-strain in orthogonal directions 320 and 322. More specifically, the polymer 302 includes a higher pre-strain in the direction 320, and little or no pre-strain in the perpendicular planar direction 322. This anisotropic pre-strain is arranged relative to the geometry of the flexures 316 and 318.

One advantage of the device 300 is that the entire structure is planar. In addition to simplifying fabrication, the planar structure of the device 300 allows for easy mechanical coupling to produce multilayer designs. By way of example, the stiff members 308 and 310 may be mechanically coupled (e.g. glued or similarly fixed) to their respective counterparts of a second device 300 to provide two devices 300 in parallel in order to increase the force output over single device 300. Similarly, the stiff member 308 from one device may be attached to the stiff member 310 from a second device in order to provide multiple devices in series that increase the deflection output over a single device 300.

In addition to good performance of the device 300 as in actuator which converts electrical energy into mechanical energy, the device 300 is also well-suited as a generator. For example, when a charge is placed on the polymer 302 while it is stretched, contraction of the device 300 converts mechanical energy to electrical energy. The electrical energy may then be harvested by a circuit in electrical communication with the electrodes 304.

6. Electronics

In the present invention, mechanical energy may be applied to a transducer in a manner that allows electrical energy to be removed from the transducer. As described with reference to FIG. 2B, many methods for applying mechanical energy and removing electrical energy from the transducer are possible. Generator devices may be designed that utilize one or more of these methods to generate electrical energy. The generation and utilization of electric al energy from the generator devices may require conditioning electronics of some type. For instance, at the very least, a minimum amount of circuitry is needed to remove electrical energy from the transducer. Further, as another example, circuitry of varying degrees of complexity may be used to increase the efficiency or quantity of electrical generation in a particular type of generator device or to convert an output voltage to a more useful value for the application generator device.

Figure 6A:
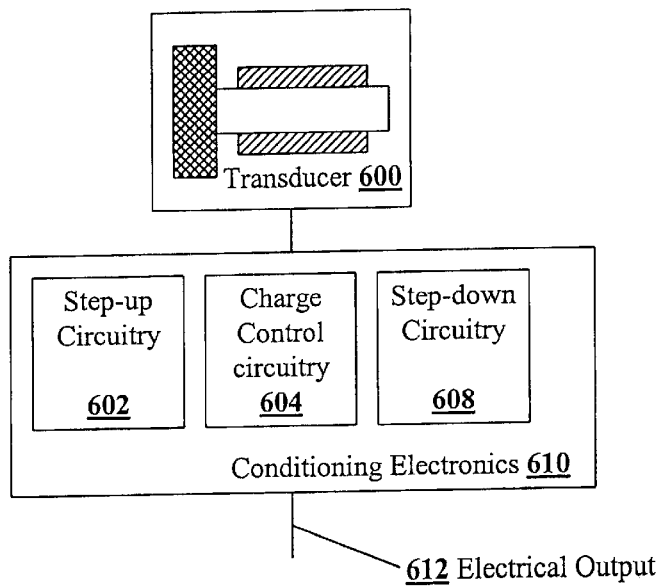
FIG. 6A is block diagram of a transducer connected to conditioning electronics.

FIG. 6A is block diagram of one or more transducers 600 connected to power conditioning electronics 610. Potential functions that may be performed circuits by the power conditioning electronics 610 include but are not limited to 1) voltage step-up performed by step-up circuitry 602, which may be used when applying a voltage to the transducer 600, 2) charge control performed by the charge control circuitry 604 which may be used to add or to remove charge from the transducer 600 at certain times of the cycle, 3) voltage step-down performed by the step-down circuitry 608 which may be used to adjust an electrical output voltage to an electrical output 612. These functions are described in more detail with reference to FIGS. 6B–6E. All of these functions may not be required in the conditioning electronics 610. For instance, some generator devices may not use step-up circuitry 602, other generator devices may not use step-down circuitry 608, or some generator devices may not use step-up circuitry and step-down circuitry. Also, some of the circuit functions may be integrated. For instance, one integrated circuit may perform the functions of both the step-up circuitry 602 and the charge control circuitry 608.

Figure 6B:
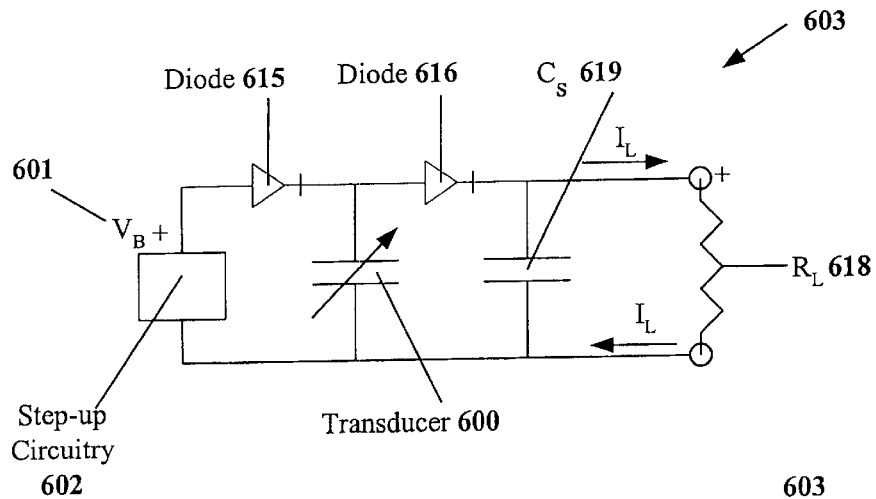
FIG. 6B is a circuit schematic of an electrical generator employing a transducer for embodiment of the present invention.

FIG. 6B is a circuit schematic of an electrical generator 603 employing a transducer 600 for one embodiment of the present invention. As described with reference to FIGS. 4A and 4B, transducers of the present invention may behave electrically as variable capacitors. To understand the operation of the generator 603, operational parameters of the generator 603 at two times, $t_1$ and $t_2$ may be compared. Without wishing to be constrained by any particular theory, a number of theoretical relationships regarding the electrical performance the generator 603 are developed. These relationships are not meant in any manner to limit the manner in which the described devices are operated and are provided for illustrative purposes only.

At a first time, $t_1$, the transducer 600 may possess a capacitance, $C_1$, and the voltage across the transducer 600 may be voltage 601, $V_B$. The voltage 601, $V_B$, may be provided by the step-up circuitry 602. At a second time $t_2$, later than time $t_1$, the transducer 600 may posses a capacitance $C_2$ which is lower than the capacitance $C_1$. Generally speaking, the higher capacitance $C_1$ occurs when the polymer transducer 600 is stretched in area, and the lower capacitance $C_2$ occurs when the polymer transducer 600 is contracted or relaxed in area. Without wishing to bound by a particular theory, the change in capacitance of a polymer film with electrodes may be estimated by well known formulas relating the capacitance to the film's area, thickness, and dielectric constant.

The decrease in capacitance of the transducer 600 between $t_1$ and $t_2$ will increase the voltage across the transducer 600. The increased voltage may be used to drive current through diode 616. The diode 615 may be used to prevent charge from flowing back into the step-up circuitry at such time. The two diodes, 615 and 616, function as charge control circuitry 604 for the transducer 600 which is part of the power conditioning electronics 610 (see FIG. 6A). More complex charge control circuits may be developed depending on the configuration of the generator 603 and the one or more transducers 600 and are not limited to the design in FIG. 6B.

The current passed through diode 616 may also be used to charge a storage capacitor 619 with capacitance Cs and to power a device of some type represented by a device load resistance 618, $R_L$. In particular embodiments, the device may be but is not limited to a portable electronic device of some type such as a cellular phone, a satellite phone, a navigational device using a GPS receiver, a heater, a radio or a battery. The battery may be used to power the portable electronic device.

Typically, a generator operates at a particular output voltage, $V_O$. When no charge is flowing through the diode 616 between $t_1$ and $t_2$, the voltage, $V_2$, that appears on the transducer at time, $t_2$, may be approximately related to the charge $Q_1$ on the transducer at $t_1$ as:

$$V_2=Q_1/C_2=C_1V_B/C_2, \text{ where } Q_1=Q_2$$

For this example, if it is assumed that $C_1$ is the maximum capacitance of the transducer and $C_2$ is the minimum capacitance of the transducer, then $V_2$ is about the maximum output voltage that could be produced by the generator 603. When charge flows through the diode 616 between $t_1$ and $t_2$, the voltage $V_2$ is lower than when no charge is flowing through the diode between $t_1$ and $t_2$ because $Q_2$ will in this case be less than $Q_1$. Thus, the maximum output voltage would be reduced.

A charge removed from the generator 603 may be simply calculated by assuming a constant operational voltage $V_O$ which is between $V_B$ and the maximum output voltage of the generator. The generators of this invention are not limited to a constant $V_O$ the example is provided for illustrative purposes only. For instance, when the operational voltage of the generator is assumed to be constant at the average of maximum and $V_B$, $$V_O = \tfrac{1}{2}(V_2+V_B) = \tfrac{1}{2}(V_B + C_1 V_B / C_2), \text{ where } Q_1 = Q_2.$$

the charge, $Q_O$, on the transducer 600 at $t_2$ is $C_2 V_O = \tfrac{1}{2} V_B (C_1 + C_2)$. In this example, the charge, $Q_{out}$, that passes through the diode 616 between $t_1$ and $t_2$ is the difference between the charge at $t_1$, $Q_1$ and the charge at time $t_2$, $Q_O$. Per expansion-contraction cycle of the transducer 600, $Q_{out}$ may be computed as follows, $$Q_{out} = Q_1 - Q_O = V_B(C_1 - C_2)/2$$

When the transducer 600 operates at a substantially constant frequency, $f$, the current, $I_L$, delivered to the a device load resistance $R_L$ 618 by the generator 603 is, $$I_L = f Q_{out} = f V_B (C_1 - C_2)/2$$

and the power, $P_L$, delivered to the load resistance 618 is, $$P_L = V_O I_L = f V_O V_B (C_1 - C_2)/2$$

In the example above, the constant frequency, $f$, is only used for illustrative purpose transducers of the present invention may operate at a constant frequency or a frequency that varies with time. Thus, the current, $I_L$, may also vary with time. For instance, for a generator using a transducer powered by a human foot strike, the operational frequency of the transducer, $f$, may vary with time according to a gait and physical characteristics of a particular person employing the generator. Thus, the operational frequency of the transducer, f, and may vary according to whether the person is running or walking.

In FIG. 6B, due to conservation of charge, for the circuit to operate, a current equal to $I_L$ is required to flow from the step-up circuitry 602. The step-up circuitry 602 may be as simple as a battery. When a battery is used, the battery supplies the power to develop the current equal to $I_L$. When an output voltage of the battery is less than $V_B$, additional circuitry (e.g. step-up circuitry 602) may be used to raise the output voltage of the battery to $V_B$. Details of one embodiment of step-up circuitry are described with respect to FIG. 6D.

Figure 6C:
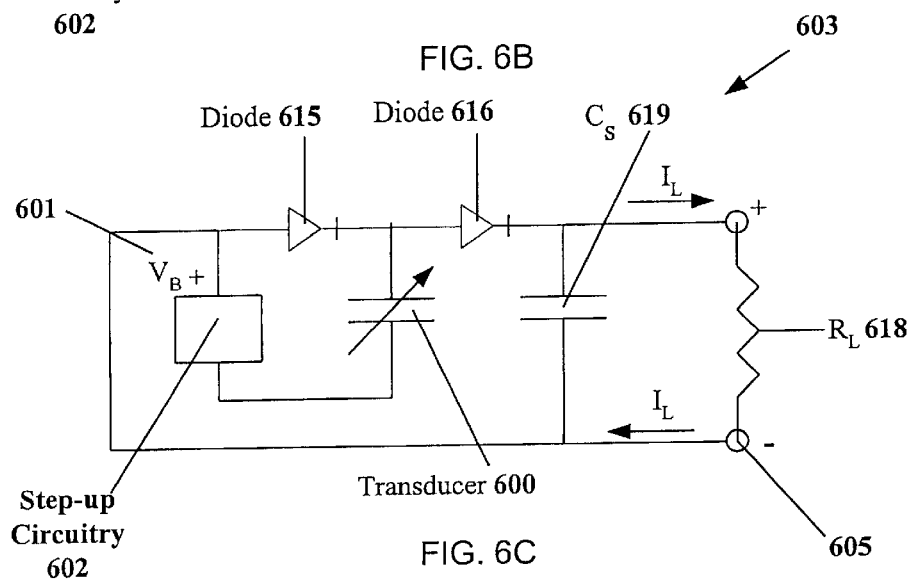
FIG. 6C is a circuit schematic of an electrical generator employing a transducer for another embodiment of the present invention.

FIG. 6C is a circuit schematic of an electrical generator employing a transducer 600 for another embodiment of the present invention. The circuit of FIG. 6C is intended to reduce the amount of current that is required to from the step-up circuitry 602. In FIG. 6C, a current $I_L$ is required to flow into the negative terminal 605. With the connection scheme in the FIG. 6C, the current, $I_L$, flowing through the negative terminal 605 reduces the amount of current that is required from the step-up circuitry 602 as compared to the circuit in FIG. 6B. The power, $P_L$, delivered to the device load resistance $R_L$ 618 may be calculated in the same manner as described with respect to FIG. 6B. However, since the connection scheme is different, the voltage, $V_L$, applied to the load 618 is equal to $V_L = V_O - V_B = V_B(C_1/C_2 - 1)2$. Thus, the power, $P_L$, applied to the load is, $$P_L = I_L V_L = f V_B^2 (C_1 - C_2)^2 / (4 C_2)$$

In FIG. 6C, an advantage of the circuit design may be a reduced power requirement for a battery used in the step-up circuitry 602 which increases the life of the battery during the operation of the generator 603.

More specifically, in the embodiment of FIG. 6B, the step-up circuitry 602 supplies a current equal to $I_L$ while in the FIG. 6C embodiment, the step-up circuitry supplies a current equal to the transducer leakage current, $I_D$. Typically, ID is much less than 1% of IL. Since the voltage, VB, may be the same in both embodiments, the power supplied by the step-up circuitry of FIG. 6C will typically be less than 1% of the power supplied by the step-up circuitry in FIG. 6B.

In FIGS. 6A and 6B, the voltage 601, $V_B$, applied to the transducer 600 may be high (e.g. thousand of volts although $V_B$ is not limited to this range). It may be undesirable to use a high-voltage battery to directly supply $V_B$. Instead, a low-voltage battery in combination with step-up circuitry 602 may be used to supply $V_B$. In some embodiments, the low-voltage battery may supply a voltage in the range of about 1–15 Volts.

Figure 6D:
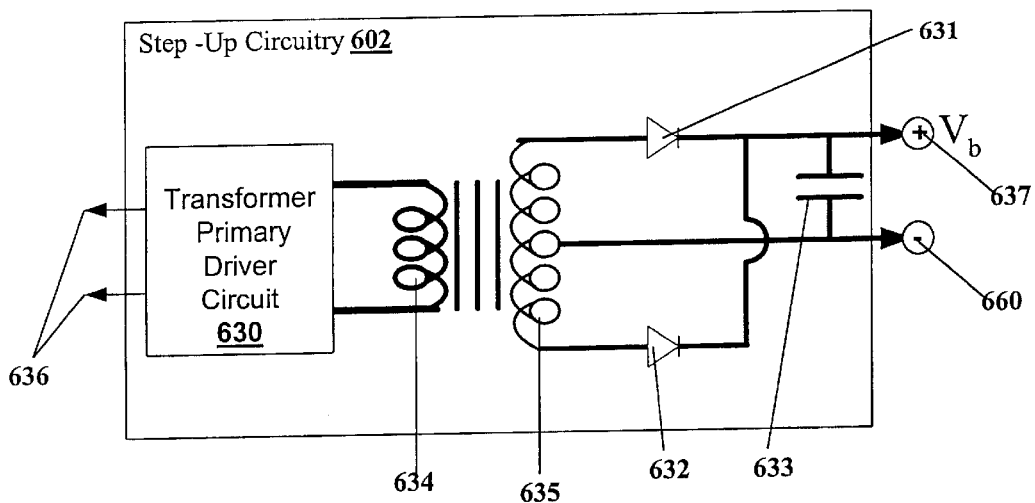
FIG. 6D is a circuit schematic of step-up circuitry for one embodiment of the present invention.

FIG. 6D is a circuit schematic of step-up circuitry 602 that may be connected to a low-voltage battery to supply $V_B$ to the transducer 603 for one embodiment of the present invention. The transformer primary driver circuit 630 may be designed to receive power from a low-voltage battery connected to an electrical input interface 636. The transformer primary driver circuit 630 operates a primary transformer winding 634 which is used to induce a voltage in a secondary winding 635 which is greater than the voltage at the electrical input interface 636. The secondary winding 635 charges a capacitor 633 via the diodes 631 and 632. The capacitor 633 may be designed to store charge when current equal to $I_L$ (see FIG. 6C) flows into a positive load terminal 637. When current is flowing into the capacitor 633, the diodes 631 and 632 are back-biased so charge will not leak from capacitor 633 by flowing through the secondary winding 635. An advantage of the step-up circuitry 602 is that as the transducer 600 is cycled (see FIG. 6C), only a small amount of battery power is needed for charging capacitor 633.

Figure 6E:
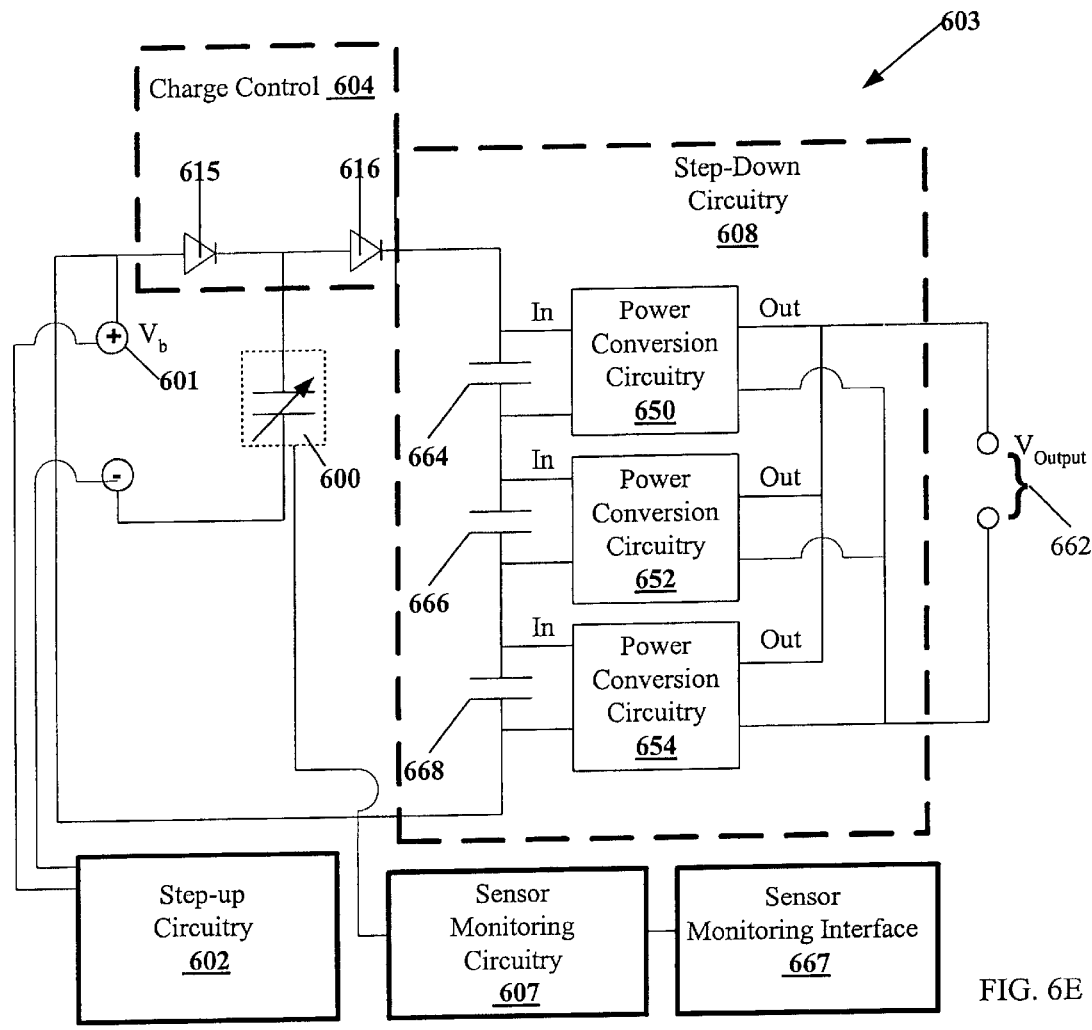
FIG. 6E is a circuit schematic of an electrical generator employing a transducer for yet another embodiment of the present invention.

FIG. 6E is a circuit schematic of an electrical generator 603 employing a transducer 600 for yet another embodiment of the present invention. Particular embodiments of the charge control circuitry 604 and the step-up circuitry 602 have been described with respect to FIGS. 6B, 6C and 6D. In FIGS. 6B and 6C, the voltage on the storage capacitor 619 may be as high as 2000–8000 Volts. Typically, it is relatively difficult to build electronic circuitry that operates at voltages above about 500 to 2500 Volts. For instance, at high voltages vacuum tube components (which are expensive, fragile and inefficient) may be required. To reduce the operational voltage of the storage capacitor 619 as well as to provide an output voltage 662 that is compatible with many common types of electronic devices, the step-down circuitry 608 may be used to replace the storage capacitor 619.

In the step-down circuitry 608, storage capacitor 619 has been replaced with a series of three capacitors 664, 666 and 668. Each of these capacitors is connected to one of the power conversion circuits, 650, 652 and 654. The number of capacitors is not limited to three. As the number of capacitors in series is increased, the input voltage to the power conversion circuits such as 650, 652 and 654 is reduced. Any number of capacitors may be used to provide an input voltage to each power conversion circuit which is consistent the voltage requirements of the power conversion circuitry and the voltage output of the one or more transducers 600. The power conversion circuits (e.g. 650, 652 and 654) may be designed to produce an appropriate output voltage. For instance, the output voltage 662 of the power conversion circuits may be 3, 5, 12 or 120 Volts but is not limited to these values. Further, in some embodiments, voltage step-up may be used to raise the output voltage 662. For instance, high voltages are typically used for power transmission. The power conversion circuits may be connected to the output interface 612 (See FIG. 6A).

The power conversion circuits may be designed to work properly with their outputs connected in parallel as in 608. The power conversion circuits may be conventional in design employing circuit topologies and components familiar to those skilled in the art. For some embodiments of the present invention, the power conversion circuits may provide galvanic isolation between their input and output terminals. Various types of circuits with varying levels of complexity that provide galvanic isolation are known in the art. One example of a power conversion circuit providing galvanic isolation is the Model APC-55 manufactured by Astrodyne, Taunton, Mass.

Various other types of step-up, step-down, and charge control circuitry are known in the prior art and may be adapted for use with the present invention. The known types include boost- and buck-type circuits which employ inductors, transistor switches, and diodes; various step-up and step-down transformer circuits; and capacitive voltage multipliers for step-up using capacitors and diodes.

The generator 603 may also include sensors and sensor monitoring circuitry 607 designed to monitor various generator parameters. These measurements may be used to monitor and/or enhance the operational performance of the generator. For instance, a sensor connected to sensor monitoring circuitry may be used to determine a power output of the generator 603. As another example, a sensor may be connected to a battery in the step-up circuitry 602 to indicate when the battery is running low and needs to be replaced. As yet another example, a number of cycles that a transducer such as 600 has been operated may be measured by a sensor and sensor monitoring circuitry. The number of cycles may be used to indicate that a device is nearing the end of its operational lifetime. As a further example, a deflection rate or a deflection distance of the transducer 600 may be measured by a sensor and sensor monitoring circuitry and used as input to control circuitry used to enhance the performance of a generator such as 603. In particular, the control circuitry may synchronize and control the operation of the circuits, 650, 652 and 654. In yet another example, a sensor such as a thermocouple and sensor monitoring circuitry may be used to measure a temperature at one or more locations within the generator 603. In a further example, the generator 603 may contain one or more sensors designed to detect characteristics of the thermal energy input into the generator 603 such as a heat transfer rate, a pressure or a temperature. The detected characteristics of the thermal energy may be used to adjust the performance of the generator to more efficiently harvest energy from the thermal energy source. Many types of sensors may be used with devices of the present invention and are not limited to the sensors described above.

The sensor monitoring circuitry may output a signal to a sensor monitoring interface 667. The sensor monitoring interface 667 may include a number of displays that may be monitored by a user of a generator such as 603. For example, a sensor monitoring interface display may be a stack of colored LED's that are activated according to the power output of the generator. A maximum power output may be represented as an entire stack of LED's being lighted. As another example, a red light on a sensor monitoring interface 667 may be activated to indicate that a battery in the step-up circuitry 602 needs to be replaced. The red light may blink in some manner or may be steady. As yet another example, a green light on the sensor monitoring interface may indicate that a chargeable battery connected to the generator 603 is fully charged. Many other types of displays such as digital displays may be used with the sensor monitoring interface 667 and are not limited to the examples described above.

As described above, the step-up circuitry 602 may be powered by a battery. For many applications, it may be inconvenient to use a battery for this purpose. For instance, in some embodiments, it may be undesirable to have to replace a battery. In yet another embodiment, the generator 603 may be used to charge a low-voltage battery not shown, connected to output interface 612. The battery may simultaneously be used to provide input power to a step-up circuit such as 602. The output of this step-up circuit would be the voltage 601, $V_B$. Thus, the frequency of battery replacement may be significantly reduced.

In some situations, the voltages on capacitors 664, 666 and 669 may become unequal which may cause a circuit failure or other problems. In another embodiment, each of the power conversion circuits, 650, 652 and 654 may include control circuitry that stops the operation of the circuit when its input voltage drops below a certain, predetermined level. This feature may help to maintain equality of the voltages on the series capacitors 664, 666 and 668.

Figure 6F:
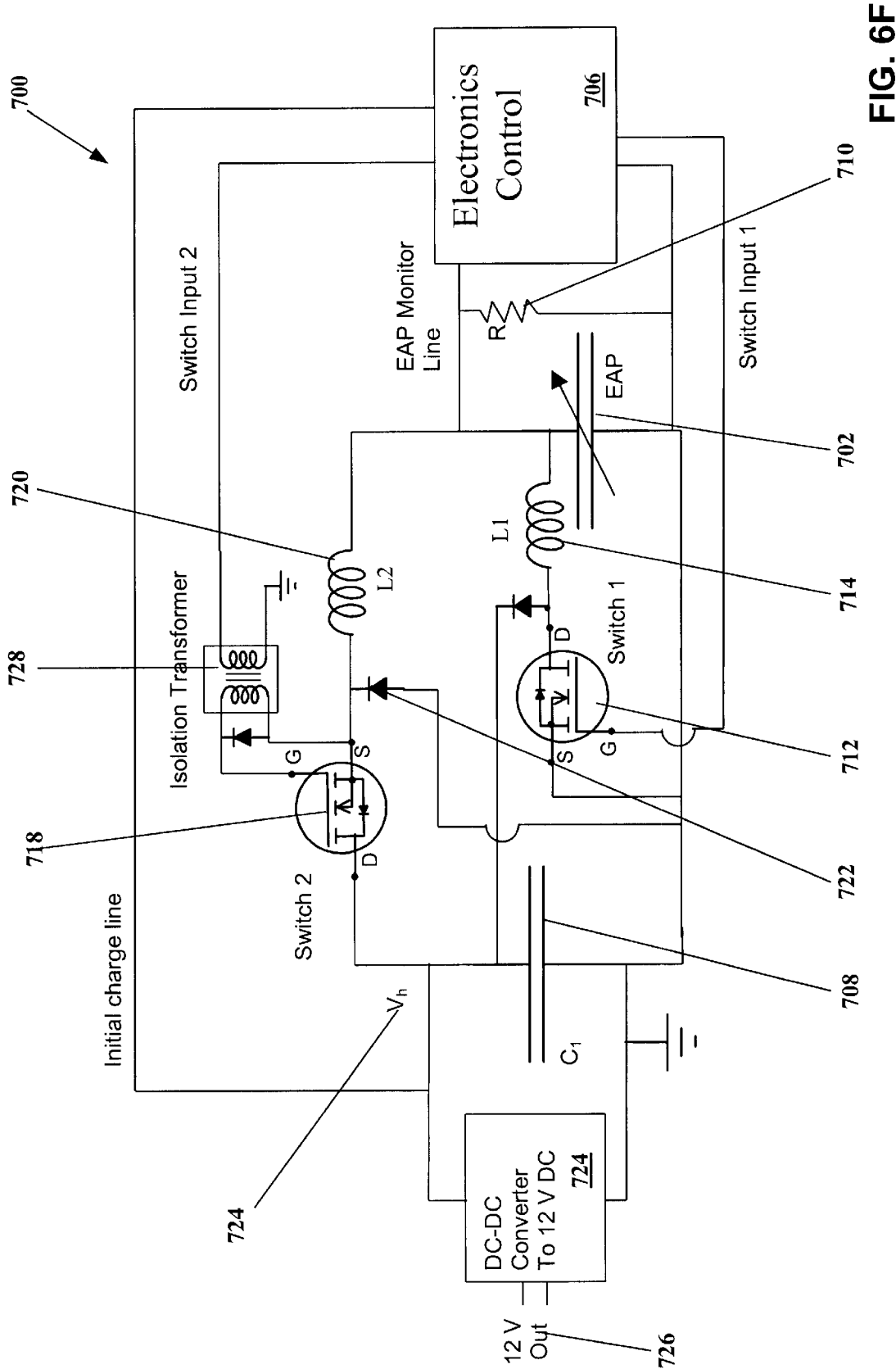
FIG. 6F shows a circuit for both adding and removing charge on EAP films of the present invention.

FIG. 6F shows a circuit 700 for both adding and removing charge on EAP films of the present invention. The circuit 700 may be used to implement a charge profile on a EAP film i.e. an amount of charge on the EAP film as a function of time. The operation of the circuit 700 in FIG. 6F may be described as follows. The EAP film, represented in FIG. 6F, as a variable capacitor 702, operates from roughly "ground" (0 V, by definition) to a high voltage, $V_h$, 704, with some allowance for offsetting from the rails 0 V and $V_h$ to improve efficiency. Initial charge is placed on the film 702 using the electronics control sub-circuit 706 which can include a small step up converter (see FIG. 6D, for instance). The electronics control sub-circuit 706 may typically include a logic device such as single chip computer or microcontroller to perform charge and voltage control functions on the EAP film 702. Alternately, at start-up, a relatively low voltage may initially placed on the capacitor $C_1$, 708, and the circuit 700 may use the mechanical-to-electrical conversion properties of the EAP film 702 (being driven by an expanding gas, for example) to raise the voltage as described below. For example, the EAP film voltage can be monitored by the electronics control sub-circuit 706 using a resistor R, 710. The resistor R, 710, may be chosen to have a sufficiently high resistance so that only a negligible amount of power is used for EAP voltage monitoring.

Assuming some initial charge on the film to put its voltage between 0 V and $V_h$, 708, charge is drained into ground by briefly switching SWITCH 712, (typically a fast transistor switch such as an FET shown or an IGBT) to its "on" or conducting state. Current flows from the EAP film 702 into ground. When SWITCH 712, is switched off, the inductor $L_1$, 714, forces charge through the diode, 716, to the high side of the capacitor $C_1$, 708. Thus, some charge may be pumped to $C_1$, 708, by draining the EAP film 702, and the amount of energy lost in lowering the voltage of the charge that goes to ground is equal to the energy added to $C_1$, 708, with an ideal circuit. When charge is added to the EAP film, 702, by switching SWITCH 718, on, charge flows from $C_1$, 708, onto the EAP film 702. When SWITCH 718 is switched off, the inductor-diode combination, 720 and 722, pulls additional charge onto the EAP film 702 from ground. Again, the amount of energy lost by the charge going from $C_1$, 708, to the EAP film 702 is equal to the energy gained by the charge pulled up from ground. In both cases of draining and charging the EAP film 702, charge is pumped from a lower to a higher voltage by the inductors, 714 and 720, i.e., from the EAP film 702 to $C_1$, 708, in draining, and from ground to the EAP film 702 in charging. Thus, charge is always being pumped to a higher voltage in the manner of a boost circuit.

The DC-DC converter 724 connected across $C_1$, 708, returns the charge to ground, in the process converting the high voltage energy to 12 V DC output, 726. The DC-DC converter 724 may be designed to operate only when the voltage on $C_1$, 708, reaches some desired value, or the DC-DC converter, 724, can be controlled by the electronics control sub-circuit 706 to begin converting high voltage to low voltage only when desired. For example, at start-up, one might initially charge $C_1$, 708, at only a relatively low voltage, but by suitably mechanically cycling the polymer and using switches 712 and 718, the voltage on $C_1$, 708, may be made to reach a high level. During the initial charge-up process the DC-DC converter 724 may not be converting to allow the energy to build up in $C_1$, 708, to the optimal level from an initial low voltage level.

If the EAP film, 702, was a purely passive device like a fixed capacitor, at best the circuit 700 would just move electrical energy around. However, the EAP film 702 is not a passive device, but a variable capacitor. Thus, by timing the charge transfers, there may be a net transfer of energy from the EAP film 702 to the capacitor, $C_1$, 708, during each cycle. Charge is removed, on average, from the EAP film 702 at a higher voltage than it is added, and the difference in energy ends up in $C_1$, 708. Thus, the DC-DC converter 724 needs to remove energy at an appropriate rate to keep $V_h$, 704, from increasing to an arbitrarily high voltage until there is an electrical breakdown. Feedback to the circuit (either internal to the DC-DC converter 724, or controlled by the electronics control sub-circuit 706 with an added control line to the DC-DC converter 726) may provide the appropriate energy removal rate so that electrical breakdown is prevented.

The switches, 712 and 718, shown in FIG. 6F may be designed or configured as follows. SWITCH 716 may use a straightforward design because its source is at ground. Thus, the electronic control circuitry 706 can easily switch SWITCH 712 directly. SWITCH 718, on the other hand, is floating at high voltage and generally needs to be isolated from the control circuitry. In FIG. 6F, a small isolation transformer 728 is used for this function, but other techniques known in the prior art, such as capacitive coupling and optoisolators, can be used with appropriate circuitry.

In circuit 700, a negative bias voltage may be incorporated, if needed, with the addition of a capacitor. Note that with the circuit in FIG. 6F, the step-up in voltage is already integrated into the charge control. Once the circuit is initially charged, charge is continuously pumped to $V_h$, 704, and a small leakage current through the EAP film 702 reduces the amount of charge pumped to $V_h$ 704 to a value that is slightly less per cycle than for zero leakage.

7. Thermal Electric Generators

Figure 7A:
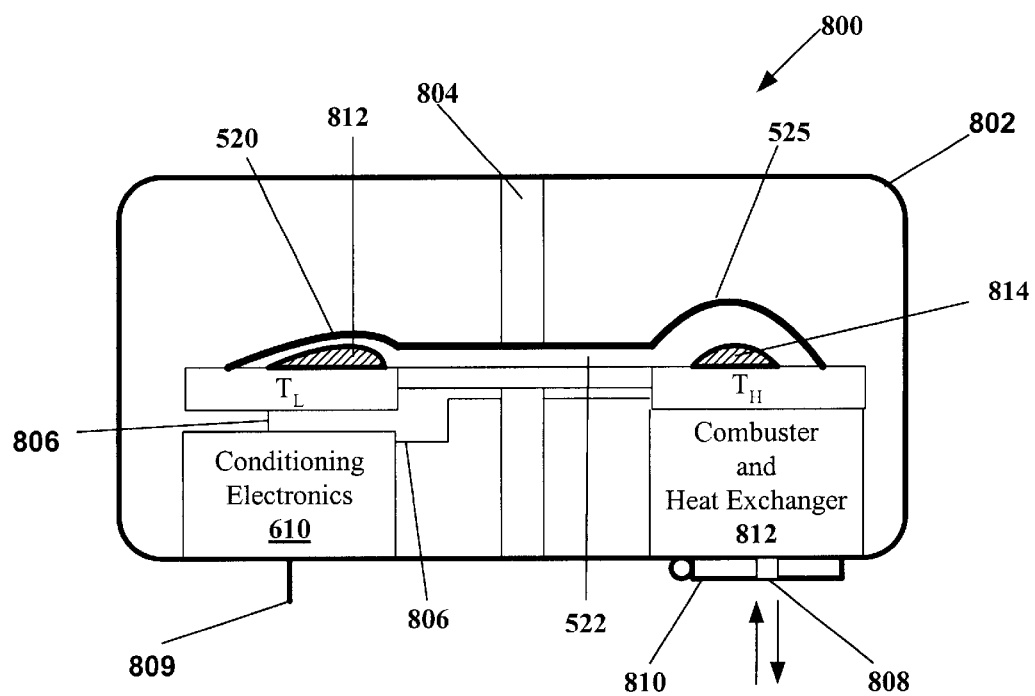
FIG. 7A is a side view of an energy conversion device designed to generate electricity for one embodiment of the present invention.

FIG. 7A is a side view of an energy conversion device 800 designed to generate electricity for one embodiment of the present invention. The energy conversion device 800 may operate on thermodynamic cycles such as a Stirling cycle as is described with reference to FIGS. 2C and 2D. The energy conversion device includes two chambers bounded by diaphragms 520 and 525 and connected via the flow conduit 522 that enclose a volume of a working fluid. The working fluid may be a gas such as helium, nitrogen, carbon dioxide, air, water, hydrocarbons, and halogenated hydrocarbons or a boilable liquid such as water. The EAP transducers, 520 and 525, a combustor and heat exchanger 812 and conditioning electronics 610 may be enclosed in a housing 802. In some embodiments, the total weight of the energy conversion device may be about 50–200 grams.

The working fluid may remain in a single phase state during the operation of the energy conversion device 800 or may utilize phase transitions. For instance, when a boilable liquid is used, the working fluid may change phase states, e.g. from a liquid to gas or a gas to a liquid, during the energy operation of the conversion device. The heat of transformation of the working fluid may be utilized by the energy conversion device to increase the efficiency of the device 800. In other embodiments, the working fluid may remain in a constant phase state such as a gas during the operation of the device.

The combustor and heat exchanger may be used to maintain the hot side of the energy conversion device 800 under diaphragm 525 at $T_H$. The combustor may burn a fuel such as propane, butane, natural gas, hydrogen, kerosene, and gasoline. An aperture 808 may be provided that allows exhaust gases to exit the combustor 812 and an oxidizer such as air to enter the combustor 812. A port 810 may open to allow fuel cartridges (not shown) to be removed and added to the combustor 812. An insulation barrier 805 may be used to prevent parasitic heat transfer from the hot side of the device at $T_H$ to the cool side of the device at $T_L$.

Inserts 812 and 814 maybe used under diaphragms 520 and 525 that substantially conform to contracted shapes of the diaphragms. The inserts, 812 and 814, minimize dead volume underneath the diaphragms, 520 and 525, when they are contracted. The inserts, 812 and 814, may allow the energy conversion device 800 to more closely approximate a Stirling cycle by reducing dead volume and may allow the diaphragms, 520 and 525 to support higher pressures.

The conditioning electronics 610 are connected via the connections 806 to the diaphragms, 520 and 525. The conditioning electronics 610, as previously described, may allow each of the diaphragms to carry a certain amount of charge as function of time that enables a thermodynamic cycle such as a Stirling cycle to be implemented. The conditioning electronics 610 may output electrical energy via the output electrical interface 809.

Figure 7B:
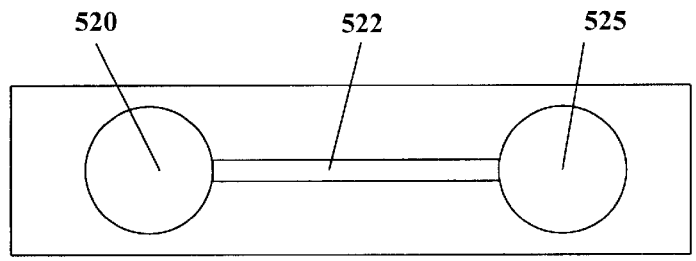
FIGS. 7B and 7C are top views of the energy conversion device of FIG. 7A
Figure 7C:
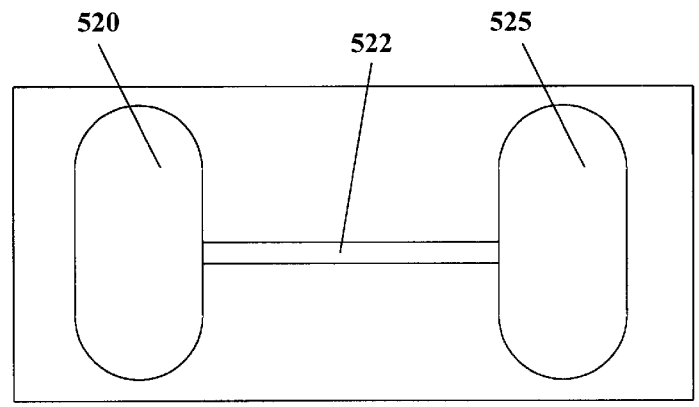

FIGS. 7B and 7C are top views of the energy conversion device of FIG. 7A. Two examples for the diaphragm shapes, 520 and 525, are shown. In FIG. 7B, the diaphragms 520 and 525 are hemispherically shaped. In FIG. 7C, the diaphragms 520 and 525 are pill shaped. Many diaphragm shapes may be used with the energy conversion devices of the present invention and are not limited to the examples shown in FIGS. 7B and 7C.

Figure 7D:
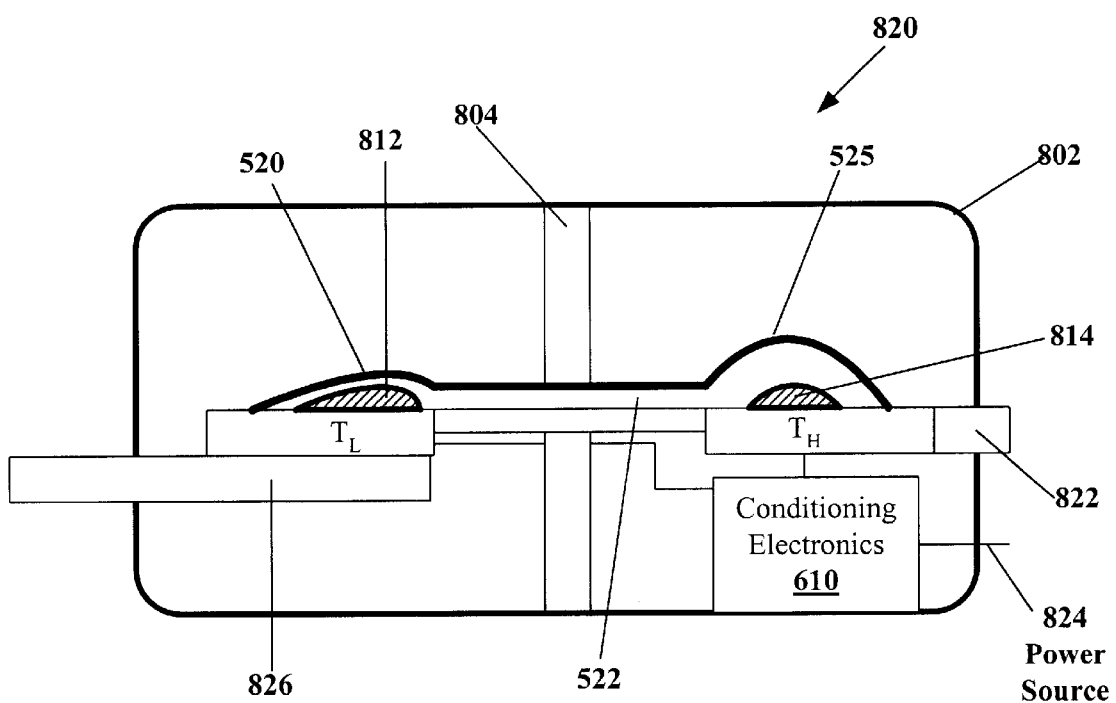
FIG. 7D is a side view of an energy conversion device designed to provide refrigeration for one embodiment of the present invention.

FIG. 7D is a side view of an energy conversion device 820 designed to provide refrigeration for one embodiment of the present invention. The device 820 may employ a Stirling refrigeration cycle as describe with reference to FIGS. 2C and 2D. The mechanical energy for cooling from EAP diaphragms, 520 and 525, is provided by converting electrical energy to mechanical energy. A sufficient charge is applied to expand the diaphragms at desired times in the cycle. The expanding diaphragms convert electrical energy to elastic mechanical energy in the polymers. Charge control is provided by the conditioning electronics 610. When some or all of the charge is removed, the diaphragms, 520 and 525, contract and elastic energy is used to compress the working fluid under the diaphragms at desired times in the cycle. The compression of the gas in diaphragm 525 forces heat into the hot side of the device at $T_H$. Excess heat may be removed from the device 820 using a heat exchanger 822. The gas is transferred in a constant volume process to diaphragm 520 where it is then expanded. Expansion cools the gas, enabling it to draw heat from the cold side $T_L$. A heat exchanger 826 may be employed by the device 820 to cool an external device such as a semi-conductor device. The gas is then transferred in a constant volume process back to diaphragm 525, where it is then compressed to repeat the cycle. The net transfer of thermal energy in the cycle is from the cold side to the hot side as required for a refrigeration cycle. The electrical energy for powering the device 820 may be provided from an external power source 824. For instance, the external power source 814 may be the power generation device described in FIG. 7A. As another example, a battery located within the device 820 may be used to power the diaphragms, 520 and 525.

8. Conclusion

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. In addition, although the present invention has been described in terms of several preferred polymer materials and geometry's having particular performance ranges, the present invention is not limited to these materials and geometry's and may have performances outside the ranges listed. It is therefore intended that the scope of the invention should be determined with reference to the appended claims.

What is claimed is:

1. A generator for converting thermal energy to electrical energy, the generator comprising:
   i) one or more transducers, each transducer comprising:
      at least two electrodes; and
      a polymer arranged in a manner which causes a change in electric field in response to a deflection applied to a portion of the polymer wherein the polymer has a maximum elastic area strain of at least 10 percent;
   ii) conditioning electronics connected to the at least two electrodes and designed or configured to add or remove electrical energy from the one or more transducers; and
   iii) one or more transmission mechanisms designed or configured to receive thermal energy and to convert a portion of the thermal energy to mechanical energy, wherein the mechanical energy results in a deflection in the portion of the polymer.

2. The generator of claim 1, wherein the one or more transmission mechanisms transfers a portion of the thermal energy via a mechanical linkage.

3. The generator of claim 1, wherein the portion of the thermal energy is converted to mechanical energy via a gas expansion.

4. The generator of claim 3, wherein the gas comprises one of helium, nitrogen, carbon dioxide, air, water, hydrocarbons, and refrigerants.

5. The generator of claim 1, wherein the one or more transmission mechanisms comprises a hydraulic fluid.

6. The generator of claim 5, wherein the hydraulic fluid is a boilable liquid.

7. The generator of claim 1, wherein the one or more transmission mechanisms comprises a heat exchange mechanism.

8. The generator of claim 7, wherein the heat exchange mechanism transfers thermal energy via heat conduction, heat convection, radiation heat transfer or combinations thereof.

9. The generator of claim 1, further comprising:
   a combustion chamber for combustion of a fuel.

10. The generator of claim 9, wherein said fuel comprises one of a liquid fuel, a gaseous fuel, a gel fuel and a solid fuel.

11. The generator of claim 9, wherein the fuel comprises a material selected from the group consisting essentially of propane, butane, natural gas, hydrogen, kerosene, and gasoline, jet fuel, diesel, coal-derived fuels, biomass and other hydrocarbon fuels.

12. The generator of claim 9, further comprising:
   at least one fuel inlet for injecting the fuel into said combustion chamber and at least one exhaust outlet for ejecting a combustion product gas mixture from said combustion chamber.

13. The generator of claim 9, further comprising:
   a storage chamber for storing the fuel.

14. The generator of claim 13, further comprising: a pump designed or configured to move the fuel from the storage chamber to the combustion chamber.

15. The generator of claim 14, wherein the pump is designed or configured to move an oxidizer to the combustion chamber.

16. The generator of claim 14, wherein the pump includes an electroactive polymer transducer.

17. The generator of claim 9, further comprising:
   an ignition device for initiating combustion in said combustion chamber.

18. The generator of claim 9, wherein a portion of a surface bounding the combustion chamber is the polymer.

19. The generator of claim 18, wherein the combustion of the fuel results in a gas expansion, said gas expansion produces the deflection of the polymer portion of the surface bounding the combustion chamber.

20. The generator of claim 18, wherein the polymer portion of the surface bounding the combustion chamber expands to form one of a balloon-like shape a hemispherical shape, a cylinder shape, or a half-cylinder shape.

21. The generator of claim 9, wherein a portion of a surface bounding the combustion chamber is a piston.

22. The generator of claim 21, wherein the combustion of the fuel moves the piston to generate mechanical energy.

23. The generator of claim 1, further comprising:
   a housing enclosing the one or more transducers, the conditioning electronics and the one or more transmission mechanisms.

24. The generator of claim 1, wherein the conditioning electronics are designed or configured to perform one or more of the following functions: voltage step-up, voltage step-down and charge control.

25. The generator of claim 24, wherein charge is added to polymer or removed from the polymer using the charge control.

26. The generator of claim 1, further comprising:
   an electrical interface designed or configured to output the electrical energy.

27. The generator of claim 1, further comprising:
one or more batteries designed or configured to store electrical energy removed from the one or more transducers or to increase the charge of the polymer.

28. The generator of claim 1, wherein the total electrical energy removed from the one or more transducers is greater than the total electrical energy added to the one or more transducers and wherein electrical energy is output from said generator.

29. The generator of claim 1, wherein the polymer comprises a material selected from the group consisting of a silicone elastomer, an acrylic elastomer, a polyurethane, a copolymer comprising PVDF, and combinations thereof.

30. The generator of claim 1, further comprising:
an insulation barrier designed or configured to minimize heat transfer between a first portion of the generator and a second portion of the generator.

31. The generator of claim 1, further comprising:
one or more support structures designed or configured to attach to said one or more transducers.

32. The generator of claim 1, further comprising:
one or more sensors connected to said generator.

33. The generator of claim 32, wherein at least one of the one or more sensors is
designed or configured to monitor a temperature or to monitor a pressure.

34. The generator of claim 32, wherein at least one of the one or more sensors is
the designed or configured to monitor at least one of the following quantities:
the deflection in the portion of the polymer, a voltage in the portion of the polymer or a
charge in the portion of the polymer.

35. The generator of claim 1, wherein the polymer comprises a first portion and a second portion arranged in a manner which causes a change in electric field in response to a deflection applied to at least one of said first portion and said second portion.

36. The generator of claim 1, further comprising:
a logic device.

37. The generator of claim 36, wherein the logic device is a microprocessor or a microcontroller.

38. The generator of claim 36, wherein the logic device is designed or configured to control an addition of charge, a deletion of charge or a combination thereof on said polymer.

39. The generator of claim 1, further comprising:
an insulation layer attached to the polymer wherein the insulation layer is designed or configured to reduce heat transfer to the polymer.

40. The generator of claim 39, wherein the insulation layer comprises at least one of a plurality of passive polymer layers, compliant inorganic materials and wetting liquids.

41. The generator of claim 1, wherein the thermal energy received by the one or more transmission mechanisms is solar energy, geothermal energy or excess energy from an engine block.

42. The generator of claim 1, wherein the polymer includes pre-strain.

43. The generator of claim 1, wherein the polymer has an elastic modulus below about 100 MPa.

44. The generator of claim 1, wherein the polymer comprises a multilayer structure.

45. The generator of claim 44, wherein the multilayer structure comprises a thermal shield layer.

46. The generator of claim 44, wherein the multilayer structure comprises a buffer layer.

47. The generator of claim 44, wherein the multilayer structure comprises two or more layers of electroactive polymers.

48. An electroactive polymer energy conversion device for converting between thermal energy and electrical energy, the energy conversion device comprising:
a) two or more transducers, each transducer comprising:
i) at least two electrodes; and
ii) a polymer arranged in a manner which causes a change in electric field in response to a deflection applied to a portion of the polymer;
b) two chambers enclosing a volume of a working fluid distributed between said chambers, the two chambers comprising:
i) a first chamber, said first chamber comprising:
a first transducer;
a first portion of the working fluid enclosed by said first chamber;
ii) a second chamber, said second chamber comprising:
a second transducer;
a second portion of the working fluid enclosed by said second chamber;
c) conditioning electronics connected to the at least two electrodes in each transducer and designed or configured to apply a charge to said transducers; and
d) one or more transmission mechanisms designed or configured to receive thermal energy.

49. The energy conversion device of claim 48, further comprising:
a flow conduit designed or configured to allow the working fluid to flow between the first chamber and the second chamber.

50. The energy conversion device of claim 48, wherein thermal energy is added or removed from a working fluid flowing in said flow conduit.

51. The energy conversion device of claim 48, further comprising:
an insulation barrier designed or configured to minimize heat transfer between said first chamber and said second chamber.

52. The energy conversion device of claim 48, wherein the conditioning electronics remove electrical energy from at least one of the said transducers.

53. The energy conversion device of claim 48, further comprising:
an electrical interface designed or configured to output the electrical energy.

54. The energy conversion device of claim 48, further comprising:
one or more batteries designed or configured to store electrical energy removed from said transducers.

55. The energy conversion device of claim 48, wherein the working fluid changes from a liquid to a gas or from a gas to a liquid.

56. The energy conversion device of claim 48, wherein the conditioning electronics are designed or configured to perform one or more of the following functions:
voltage step-up, voltage step-down, and charge control.

57. The energy conversion device of claim 48, further comprising:
one or more batteries are designed or configured to increase the charge of the polymer.

58. The energy conversion device of claim 48, wherein the working fluid in the first chamber is maintained at about a first temperature and the working fluid in the second chamber is maintained at about a second temperature.

59. The energy conversion device of claim 48, further comprising:
a housing enclosing the two or more transducers, the two chambers, the conditioning electronics and the one or more transmission mechanisms.

60. The energy conversion device of claim 48, wherein the polymer comprises a material selected from the group consisting of a silicone elastomer, an acrylic elastomer, a polyurethane, a copolymers comprising PVDF, and combinations thereof.

61. The energy conversion device of claim 48, further comprising:
an insulation layer attached to the polymer wherein the insulation layer is designed or configured to reduce heat transfer to the polymer.

62. The energy conversion device of claim 61, wherein the insulation layer comprises one or more of a plurality of passive polymer layers, compliant inorganic material, wetting liquids and combinations thereof.

63. The energy conversion device of claim 48, further comprising:
one or more sensors connected to said generator.

64. The energy conversion device of claim 63, wherein at least of one of said sensors is designed or configured to monitor a temperature.

65. The energy conversion device of claim 48, wherein the polymer comprises a first portion and a second portion arranged in a manner which causes a change in electric field in response to a deflection applied to at least one of the first portion and the second portion.

66. The energy conversion device of claim 48, wherein the polymer expands to form one of a balloon-like shape, a hemispherical shape, a cylinder shape, or a half-cylinder shape.

67. The energy conversion device of claim 48, wherein said two or more transducers, the first chamber, the second chamber, the conditioning electronics and the one or more transmission mechanisms are fabricated on a semiconductor substrate.

68. The energy conversion device of claim 48, further comprising:
an insert located within said first chamber designed or configured to substantially conform to a contracted shape of the polymer of said first transducer.

69. The energy conversion device of claim 48, further comprising:
an insert located within said second chamber designed or configured to substantially conform to a contracted shape of the polymer of said second transducer.

70. The energy conversion device of claim 48, further comprising;
a plurality of chamber pairs enclosing a volume of a working fluid distributed between said chamber pairs.

71. The energy conversion device of claim 48, wherein the thermal energy is applied to the working fluid in said first chamber to expand said working fluid and wherein the expansion of said working fluid deflects the polymer in said first chamber.

72. The energy conversion device of claim 71, wherein the working fluid comprises one of helium, nitrogen, carbon dioxide, air, water, hydrocarbons, and refrigerants.

73. The energy conversion device of claim 71, wherein the working fluid in said first chamber is transferred to said second chamber via a flow conduit.

74. The energy conversion device of claim 73, wherein the total volume of said working fluid in the first chamber, the second chamber and the flow conduit during said transfer remains substantially constant.

75. The energy conversion device of claim 73, wherein the working fluid in said second chamber is expanded resulting in a temperature reduction in the working fluid.

76. The energy conversion device of claim 73, wherein the working fluid in said second chamber is expanded at a substantially constant temperature.

77. The energy conversion device of claim 48, wherein a first transmission mechanism is designed or configured to receive thermal energy and transfer a portion of thermal energy to said first chamber.

78. The energy conversion device of claim 77, wherein the first transmission mechanism transfers the portion of the thermal energy via a fluid.

79. The energy conversion device of claim 78, wherein the fluid comprises one of water and a hydraulic oil, and a heat transfer fluid comprising hydrocarbons.

80. The energy conversion device of claim 77, wherein the first transmission mechanism comprises a heat exchange mechanism.

81. The energy conversion device of claim 80, wherein the heat exchange mechanism transfers a portion of thermal energy via at least one of heat conduction, heat convection, and radiation heat transfer.

82. The energy conversion device of claim 77, wherein said first transmission mechanism include a combustion chamber for combusting a fuel.

83. The energy conversion device of claim 82, wherein the fuel is a solid fuel, a liquid fuel, a gel fuel or a gaseous fuel.

84. The energy conversion device of claim 77, wherein the fuel is selected from group consisting essentially of propane, butane, natural gas, hydrogen, kerosene, and gasoline, jet fuel, diesel, coal-derived fuels, biomass and other hydrocarbon fuels.

85. The energy conversion device of claim 82, further comprising:
at least one fuel inlet for injecting the fuel into said combustion chamber and at least one exhaust outlet for ejecting a combustion product mixture from said combustion chamber.

86. The energy conversion device of claim 82, further comprising:
an ignition device for initiating combustion in said combustion chamber.

87. The energy conversion device of claim 77, wherein the first transmission mechanism receives thermal energy generated from an external heat source.

88. The energy conversion device of claim 87, wherein the external heat comprises one of a solar heat source, an external combustion heat source, a geothermal heat source, and excess energy from an engine block and a waste heat source.

89. The energy conversion device of claim 48, wherein the polymer in the first chamber is contracted to compress the working fluid in said first chamber.

90. The energy conversion device of claim 89, wherein a portion of thermal energy generated during the compression of said working fluid in said first chamber is transferred via a heat exchanger.

91. The energy conversion device of claim 89, wherein the working fluid comprises one of helium, nitrogen, carbon dioxide, air, refrigerants, hydrocarbons and water.

92. The energy conversion device of claim 89, wherein the working fluid in said first chamber is transferred to said second chamber via a flow conduit.

93. The energy conversion device of claim 92, wherein a total volume of said working fluid in the first chamber, the second chamber and the flow conduit during said transfer remains substantially constant.

94. The energy conversion device of claim 92 wherein the working fluid in said second chamber is expanded resulting in a temperature reduction in the working fluid.

95. The energy conversion device of claim 92 wherein the working fluid in said second chamber is expanded at a substantially constant temperature.

96. The energy conversion device of claim 89, wherein the compression of said working fluid converts a portion said working fluid to a liquid.

97. The energy conversion device of claim 96, wherein the working fluid comprises a material essentially of ammonia and refrigerants.

98. The energy conversion device of claim 89, wherein a first transmission mechanism is designed or configured to cool an external device.

99. The energy conversion device of claim 98, wherein the external device is a semiconductor device.

100. The energy conversion device of claim 98, wherein the external device is a refrigerator.

101. An energy conversion device for convening thermal energy to electrical energy, the energy conversion device comprising:
   i) one or more transducers, each transducer comprising:
      at least two electrodes; and
      a polymer arranged in a manner which causes a change in electric field in response to a deflection applied to a portion of the polymer wherein the polymer includes pre-strain;
   ii) conditioning electronics connected to the at least two electrodes and designed or configured to add or remove electrical energy from the one or more transducers; and
   iii) one or more transmission mechanisms designed or configured to receive thermal energy and to convert a portion of the thermal energy to mechanical energy, wherein the mechanical energy results in a deflection in the portion of the polymer.

102. The generator of claim 1, further comprising:
step-down circuitry designed or configured to receive an input signal with an input voltage level and output an output signal with an output voltage level wherein the output voltage level is lower than the input voltage level.

103. The generator of claim 102, wherein said input sign ail is received from the charge control circuitry.

104. The generator of claim 102, further comprising:
an electrical output interface designed or configured to output the output signal.

105. The generator of claim 104, wherein the electrical output interface is connected to a battery.

106. The generator of claim 102, wherein the output voltage level is between about 3 Volts and about 400 Volts.

107. The generator of claim 102, further comprising:
one or more power conversion circuitry units.

108. The generator of claim 107, further comprising;
one or more capacitors designed or configured to reduce a voltage level of a signal received by said one or more power conversion circuitry units.

109. The generator of claim 1, further comprising:
step up circuitry designed or configured to receive an input signal with an input voltage level and output an output signal with an output voltage level wherein the input voltage level is lower than the output voltage level.

110. The generator of claim 109, wherein the output signal is received by the charge control circuitry.

111. The generator of claim 110, further comprising:
an electrical input interface designed or configured to receive an input signal.

112. The generator of claim 111, wherein the electrical input interface is connected to a battery.

113. The generator of claim 112, wherein a voltage of said battery is between about 1.5 Volts and about 48 Volts.

114. The generator of claim 109, further comprising:
a transformer.

115. The generator of claim 114, further comprising:
a transformer driver circuit for controlling said transformer.

116. The generator of claim 109, further comprising:
one or more sensor monitoring circuits.

117. The generator of claim 116, wherein at least one of the sensor monitoring circuits is designed or configured to monitor at least one of a temperature, a pressure, the deflection of the polymer, a charge on the polymer or a voltage on the polymer.

118. The generator of claim 116, further comprising:
a sensor output interface.

119. The energy conversion device of claim 101, wherein the charge control circuitry is designed to add charge to the one or more transducers or remove charge from the one or more transducers.

120. The energy conversion device of claim 101, further comprising:
a logic device.

121. The energy conversion device of claim 120, wherein the logic device is designed or configured to determine an amount of charge to add or to delete from the polymer.

122. The energy conversion device of claim 121, wherein the amount of charge is determined from charge control algorithm.

123. A generator for convening thermal energy to electrical energy, the generator comprising:
   i) one or more transducers, each transducer comprising:
      at least two electrodes; and
      a polymer arranged in a manner which causes a change in electric field in response to a deflection applied to a portion of the polymer;
   ii) conditioning electronics connected to the at least two electrodes and designed or configured to add or remove electrical energy from the one or more transducers; and
   iii) one or more transmission mechanisms designed or configured to receive thermal energy and to convert a portion of the thermal energy to mechanical energy, wherein the mechanical energy results in a deflection in the portion of the polymer and wherein the one or more transmission mechanisms comprises a hydraulic fluid.

124. A generator for converting thermal energy to electrical energy, the generator comprising:
   i) one or more transducers, each transducer comprising:
      at least two electrodes; and
      a polymer arranged in a manner which causes a change in electric field in response to a deflection applied to a portion of the polymer;
   ii) conditioning electronics connected to the at least two electrodes and designed or configured to add or remove electrical energy from the one or more transducers;
   iii) one or more transmission mechanisms designed or configured to receive thermal energy and to convert a portion of the thermal energy to mechanical energy, wherein the mechanical energy results in a deflection in the portion of the polymer; and iv) one or more sensors connected to said generator wherein at least one of the one or more sensors is designed or configured to monitor at least one of the following quantities: the deflection in the portion of the polymer, a voltage in the portion of the polymer or a charge in the portion of the polymer.

125. A generator for converting thermal energy to electrical energy, the generator comprising:
   i) one or more transducers, each transducer comprising:
      at least two electrodes; and
      a polymer arranged in a manner which causes a change in electric field in response to a deflection applied to a portion of the polymer;
   ii) conditioning electronics connected to the at least two electrodes and designed or configured to add or remove electrical energy from the one or more transducers;
   iii) one or more transmission mechanisms designed or configured to receive thermal energy and to convert a portion of the thermal energy to mechanical energy, wherein the mechanical energy results in a deflection in the portion of the polymer; and
   iv) a logic device.

126. A generator for converting thermal energy to electrical energy, the generator comprising:
   i) one or more transducers, each transducer comprising:
      at least two electrodes; and
      a polymer arranged in a manner which causes a change in electric field in response to a deflection applied to a portion of the polymer;
   ii) conditioning electronics connected to the at least two electrodes and designed or configured to add or remove electrical energy from the one or more transducers; and
   iii) one or more transmission mechanisms designed or configured to receive thermal energy and to convert a portion of the thermal energy to mechanical energy, wherein the mechanical energy results in a deflection in the portion of the polymer and wherein the polymer includes pre-strain.

127. A generator for converting thermal energy to electrical energy, the generator comprising:
   i) one or more transducers, each transducer comprising:
      at least two electrodes; and
      a polymer arranged in a manna which causes a change in electric field in response to a deflection applied to a portion of the polymer;
   ii) conditioning electronics connected to the at least two electrodes and designed or configured to add or remove electrical energy from the one or more transducers; and
   iii) one or more transmission mechanisms designed or configured to receive thermal energy and to convert a portion of the thermal energy to mechanical energy, wherein the mechanical energy results in a deflection in the portion of the polymer and wherein the polymer comprises a multiplayer structure.

* * * * *